(12) United States Patent
Yamazaki

(10) Patent No.: US 9,922,551 B2
(45) Date of Patent: *Mar. 20, 2018

(54) REMOTE CONTROL SYSTEM

(71) Applicant: Semiconductor Energy Laboratory Co., LTD., Atsugi-shi, Kanagawa-ken (JP)

(72) Inventor: Shunpei Yamazaki, Tokyo (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/378,413

(22) Filed: Dec. 14, 2016

(65) Prior Publication Data

US 2017/0092119 A1    Mar. 30, 2017

Related U.S. Application Data

(63) Continuation of application No. 15/071,275, filed on Mar. 16, 2016, now Pat. No. 9,536,422, which is a (Continued)

(30) Foreign Application Priority Data

Jul. 5, 2012 (JP) ................. 2012-151234

(51) Int. Cl.
*G08C 19/16* (2006.01)
*G08C 17/02* (2006.01)
(Continued)

(52) U.S. Cl.
CPC ............ *G08C 17/02* (2013.01); *H01L 27/124* (2013.01); *H01L 27/1207* (2013.01);
(Continued)

(58) Field of Classification Search
None
See application file for complete search history.

(56) References Cited

U.S. PATENT DOCUMENTS 6,308,231 B1 * 10/2001 Galecki ............... G05B 19/054
                                                       702/127
6,407,899 B1    6/2002 Carpenter
(Continued)

FOREIGN PATENT DOCUMENTS

EP    2503685 A    9/2012
JP    07-059274 A    3/1995
(Continued)

*Primary Examiner* — George Bugg
*Assistant Examiner* — Renee Dorsey
(74) *Attorney, Agent, or Firm* — Nixon Peabody LLP; Jeffrey L. Costellia

(57) ABSTRACT

Provided is a remote control system with which leakage current flowing in a switch can be reduced so that power consumption can be reduced. The remote control system includes a portable information terminal, a server, and an electric device. The on/off of the switch included in the electric device is controlled using information transmitted from the portable information terminal to the server. The switch includes a transistor formed using a semiconductor whose band gap is larger than that of single crystal silicon in a channel formation region.

6 Claims, 12 Drawing Sheets

Related U.S. Application Data continuation of application No. 13/927,827, filed on Jun. 26, 2013, now Pat. No. 9,312,390.

(51) Int. Cl.
*H01L 29/786* (2006.01)
*H01L 27/12* (2006.01)
*H02M 7/04* (2006.01)
*H02M 7/44* (2006.01)

(52) U.S. Cl.
CPC .......... *H01L 29/7869* (2013.01); *H02M 7/04* (2013.01); *H02M 7/44* (2013.01); *G08C 2201/00* (2013.01)

(56) References Cited

U.S. PATENT DOCUMENTS

| | | | |
|---|---|---|---|
| 7,602,157 | B2 | 10/2009 | Babcock et al. |
| 7,674,650 | B2 | 3/2010 | Akimoto et al. |
| 7,898,229 | B2 | 3/2011 | Babcock et al. |
| 8,344,788 | B2 | 1/2013 | Yamazaki et al. |
| 8,729,842 | B2 | 5/2014 | Babcock et al. |
| 8,823,439 | B2 | 9/2014 | Yamazaki et al. |
| 8,952,728 | B2 | 2/2015 | Takewaki et al. |
| 8,999,751 | B2 | 4/2015 | Yamazaki et al. |
| 9,006,728 | B2 | 4/2015 | Yamazaki et al. |
| 9,040,980 | B2 | 5/2015 | Endo |
| 9,136,391 | B2 | 9/2015 | Yamazaki et al. |
| 9,349,791 | B2 | 5/2016 | Yamazaki et al. |
| 9,865,744 | B2 | 1/2018 | Yamazaki et al. |
| 2007/0080905 | A1* | 4/2007 | Takahara ............ G09G 3/3233 345/76 |
| 2008/0068207 | A1 | 3/2008 | Elberbaum |
| 2008/0148476 | A1 | 6/2008 | Lin |
| 2009/0083374 | A1* | 3/2009 | Saint Clair ............ G05B 15/00 709/203 |
| 2009/0152364 | A1* | 6/2009 | Spivey, Jr. ......... G06K 19/0707 235/492 |
| 2009/0218891 | A1* | 9/2009 | McCollough, Jr. ..... H02J 17/00 307/154 |
| 2011/0045761 | A1 | 2/2011 | Rolf et al. |
| 2011/0106279 | A1 | 5/2011 | Cho et al. |
| 2011/0287757 | A1 | 11/2011 | Nykoluk et al. |
| 2013/0128333 | A1 | 5/2013 | Agrawal et al. |
| 2016/0260839 | A1 | 9/2016 | Yamazaki et al. |

FOREIGN PATENT DOCUMENTS

| | | |
|---|---|---|
| JP | 2009-522998 | 6/2009 |
| JP | 2009-218014 A | 9/2009 |
| JP | 2010-152416 A | 7/2010 |
| JP | 2010-206914 A | 9/2010 |
| JP | 2011-100992 A | 5/2011 |
| JP | 2011-172217 A | 9/2011 |
| JP | 2011-222990 A | 11/2011 |
| JP | 2012-070364 A | 4/2012 |
| WO | WO-2007/136422 | 11/2007 |
| WO | WO-2011/043170 | 4/2011 |
| WO | WO-2011/089841 | 7/2011 |
| WO | WO-2011/118364 | 9/2011 |

* cited by examiner

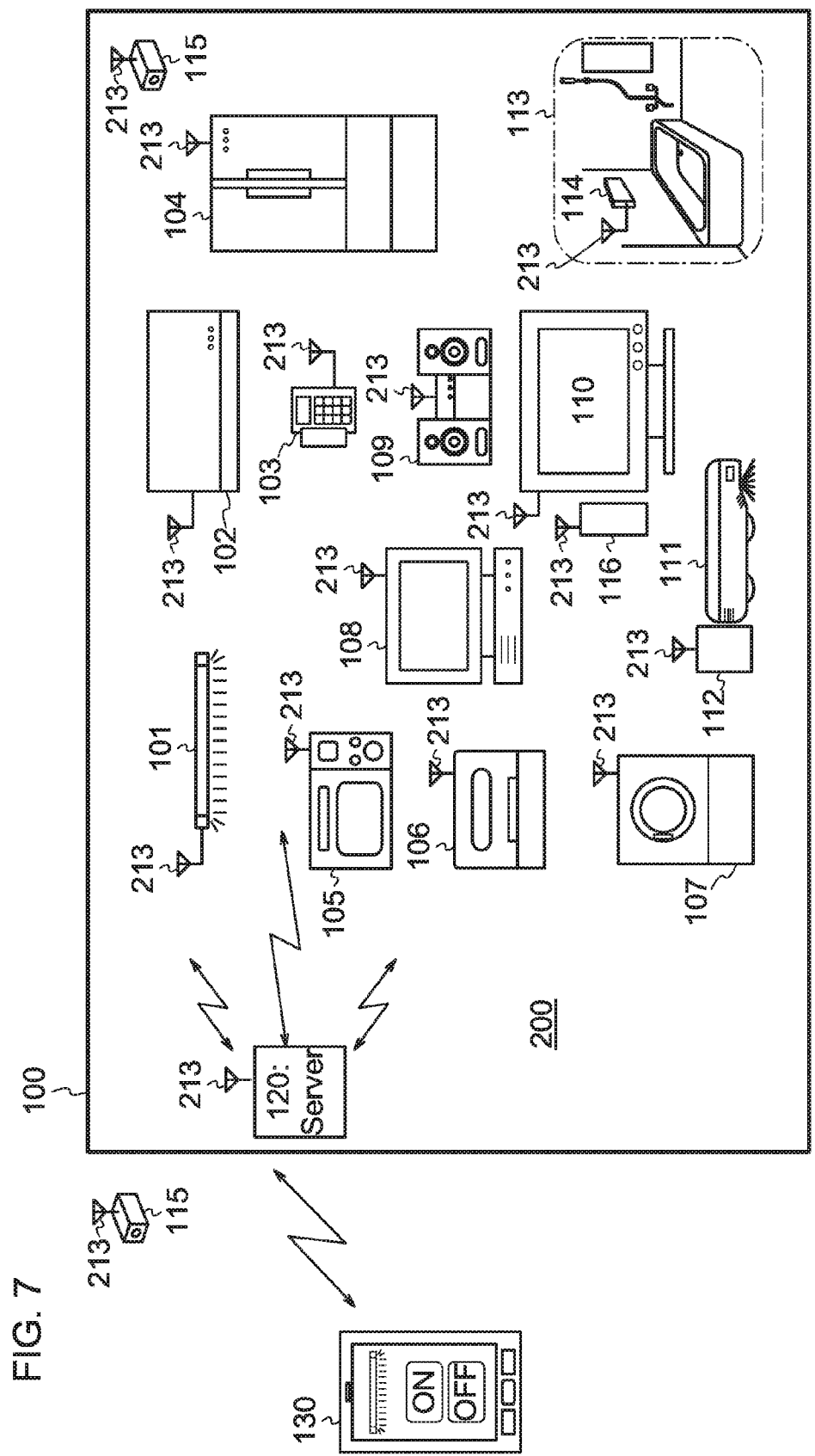

REMOTE CONTROL SYSTEM

BACKGROUND OF THE INVENTION

1. Field of the Invention

The present invention relates to a remote control of an electric device. The present invention also relates to a reduction in power consumption of an electric device.

2. Description of the Related Art

In recent years, the demand for an electric device to be operated by remote control with the use of a portable information terminal typified by a mobile phone, a smartphone, or the like is increased. In many cases, an electric device is configured so that power supply to the electric device is adjusted by control of a switching element connected to a commercial power supply or a battery (e.g., see Patent Document 1).

REFERENCE

Patent Document

[Patent Document 1] Japanese Published Patent Application No. 2010-206914

SUMMARY OF THE INVENTION

As an example of the operation control of an electric device by remote control, the on/off operation control of a switching element for supplying power to a load included in the electric device can be given. As the switching element (hereinafter, also simply referred to as a "switch") with which power supply from a power supply source to the load included in the electric device is controlled, in the case of supplying power to a load which needs high power, a power MOSFET or an insulated gate bipolar transistor (IGBT) is generally used. Further, in the case of supplying power to a load such as an electronic circuit, a thin film transistor is generally used as the switch. The power MOSFET, the IGBT, and the thin film transistor are each formed using a material including silicon.

When a switching element formed using a material containing silicon is used to control power supply, a problem arises in that standby power consumed while the electric device is turned off tends to increase. Standby power is mainly due to leakage current flowing in the switching element while the electric device is turned off, and an increase in standby power leads to an increase in power consumption. Accordingly, to reduce power consumption, it is necessary to reduce leakage current flowing in the switching element.

However, since leakage current flows in a conventional switching element even in a standby mode as described above, it is difficult to reduce power consumption in a standby mode.

In view of the above-described technical background, one object of the present invention is to provide a remote control system with which leakage current flowing in a switching element can be reduced so that power consumption can be reduced.

One embodiment of the present invention is a remote control system including a portable information terminal, a server, and an electric device. The server transmits information for controlling on/off of a switch included in the electric device on the basis of information transmitted from the portable information terminal. The switch included in the electric device includes a transistor formed using a semiconductor whose band gap is larger than that of single crystal silicon in a semiconductor layer where a channel is formed.

One embodiment of the present invention is a remote control system including a portable information terminal, a server which transmits/receives information to/from the portable information terminal, and an electric device. The electric device includes a communication circuit, a power supply circuit, and a load and transmits/receives information to/from the server by the communication circuit. The power supply circuit includes a switch whose on/off is controlled using information transmitted from the server and supplies power to the load through the switch. The switch includes a transistor formed using a semiconductor whose band gap is larger than that of single crystal silicon in a semiconductor layer where a channel is formed.

The portable information terminal and the server can be connected to each other through a telephone line, an internet line, or the like to transmit/receive information to/from each other. Further, the server and the electric device each including a communication circuit can be connected to each other by wire communication with a LAN cable or the like or wireless communication with a wireless LAN or the like, for example, to transmit/receive information to/from each other. Alternatively, information may be transmitted/received by optical communication using visible light, infrared light, or the like.

The on/off of the switch can be determined by information stored in the server. In addition, operating information of the electric device can be transmitted to the portable information terminal through the server.

The portable information terminal and the electric device may communicate directly with each other without through the server.

The above-described semiconductor whose band gap is larger than that of single crystal silicon is preferably an oxide semiconductor. A transistor including an oxide semiconductor for a semiconductor layer (active layer) where a channel is formed can withstand high voltage so that dielectric breakdown does not occur even when voltage between a source and a drain is higher than or equal to 100 V, preferably higher than or equal to 200 V, further preferably higher than or equal to 500 V. Further, in the transistor including an oxide semiconductor for the active layer, the on-resistance between the source and the drain is small. Accordingly, when the transistor including an oxide semiconductor for the semiconductor layer where the channel is formed is used as the switch used for supplying power, power loss due to switching can be small. Furthermore, the transistor including an oxide semiconductor for the semiconductor layer where the channel is formed has extremely low current flowing between the source and the drain when the transistor is turned off (hereinafter, also referred to as "off-state current"). For these reasons, power consumption of the electric device in a non-operation state can be reduced.

Note that the transistor including an oxide semiconductor for the semiconductor layer where the channel is formed can be used not only as the switch used for supplying power but also as a different switch.

After the oxide semiconductor is formed, heat treatment is performed at a temperature higher than or equal to 900° C. and lower than or equal to 1500° C. in a vacuum atmosphere, a nitrogen atmosphere, an oxygen atmosphere, or a mixed atmosphere of nitrogen and oxygen to obtain the density and the crystallinity which are substantially the same level as those of a single-crystal oxide semiconductor.

Note that the electric device described in this specification may be an electrical appliance such as a computer, a detector, or a television; a device included in a computer system (e.g., a CPU, a memory, a HDD, a printer, or a monitor); or an electricity-controlled device incorporated in a car. Alternatively, the electric device may be an internal part of an LSI such as a CPU or a semiconductor memory. Here, the computer refers to not only a tablet computer, a notebook computer, and a desktop computer, but also a large computer such as a server system. The concept of the electric device described in this specification can be applied to social infrastructure which requires power supply system.

One embodiment of the present invention can provide a remote control system with which leakage current flowing in a switching element can be reduced so that power consumption can be reduced.

BRIEF DESCRIPTION OF THE DRAWINGS

FIG. 7 illustrates a structural example of a remote control system in one embodiment of the present invention.

DETAILED DESCRIPTION OF THE INVENTION

Figure 1A:
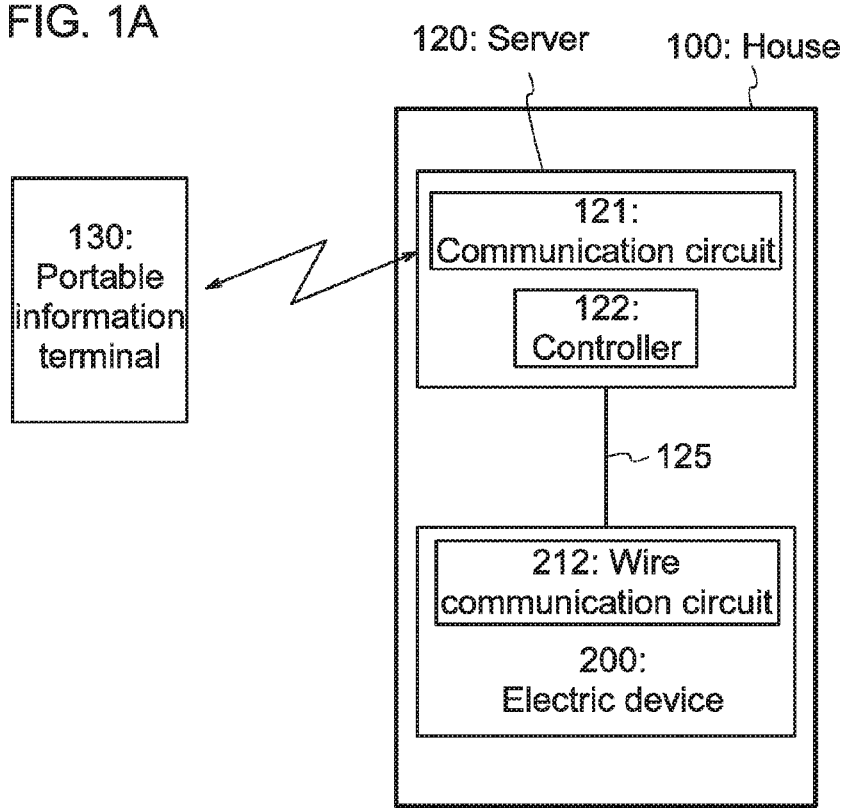
FIGS. 1A and 1B each illustrate a structural example of a remote control system in one embodiment of the present invention.

Embodiments will be described in detail with reference to the accompanying drawings. Note that the present invention is not limited to the following description, and it will be easily understood by those skilled in the art that various changes and modifications can be made without departing from the spirit and scope of the invention. Therefore, the present invention should not be construed as being limited to the description in the following embodiments. In the structures of the invention described below, the same portions or portions having similar functions are denoted by the same reference numerals in different drawings, and explanation thereof will not be repeated.

Note that a semiconductor device in this specification and the like indicates all the devices that can operate by utilizing semiconductor characteristics; and for example, electro-optical devices, display devices, light-emitting devices, semiconductor circuits, and electronic appliances are all included in the category of the semiconductor devices.

In this specification and the like, ordinal numbers such as "first", "second", and "third" are used in order to avoid confusion among components, and the terms do not limit the components numerically.

Note that the position, size, range, or the like of each structure illustrated in the drawings and the like is not accurately represented in some cases for easy understanding. Therefore, the disclosed invention is not necessarily limited to the position, size, range, or the like as disclosed in the drawings and the like.

Further, functions of a "source" and a "drain" of a transistor are sometimes interchanged with each other when a transistor of opposite polarity is used or when the direction of current flow is changed in circuit operation, for example. Thus, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can include the case where a plurality of "electrodes" or "wirings" are formed in an integrated manner.

In this specification, the trigonal and rhombohedral crystal systems are included in the hexagonal crystal system.

Note that an explicit description "X and Y are connected" can mean that X and Y are electrically connected, that X and Y are functionally connected, and that X and Y are directly connected. Here, each of X and Y denotes an object (e.g., a device, an element, a circuit, a wiring, an electrode, a terminal, a conductive layer, or an insulating layer). Accordingly, a connection relation other than connection relations illustrated in drawings and texts is also included, without limitation to a predetermined connection relation, for example, the connection relations illustrated in the drawings and the texts.

In the drawings, a transistor including an oxide semiconductor in a semiconductor layer where a channel is formed is denoted by a circuit symbol "OS" so that it can be clearly identified as a transistor including an oxide semiconductor in a semiconductor layer where a channel is formed.

Embodiment 1

One embodiment of the present invention is described with reference to FIGS. 1A and 1B. A house 100 illustrated in FIG. 1A includes a server 120 and an electric device 200. The electric device 200 includes a wire communication circuit 212 and is connected to the server 120 through a wired LAN 125. The server 120 includes a communication circuit 121 and a controller 122. The communication circuit 121 transmits/receives information to/from a portable information terminal 130 through a telecommunication line such as a telephone line or an internet line. It is preferable that encrypted information be transmitted/received. The server 120 can control the operation of the electric device 200 by the controller 122 and can recognize operating information of the electric device 200. The portable information terminal 130 can remotely control the server 120 through the telecommunication line. This means that the portable information terminal 130 can remotely control the electric device 200 through the server 120.

Figure 2A:
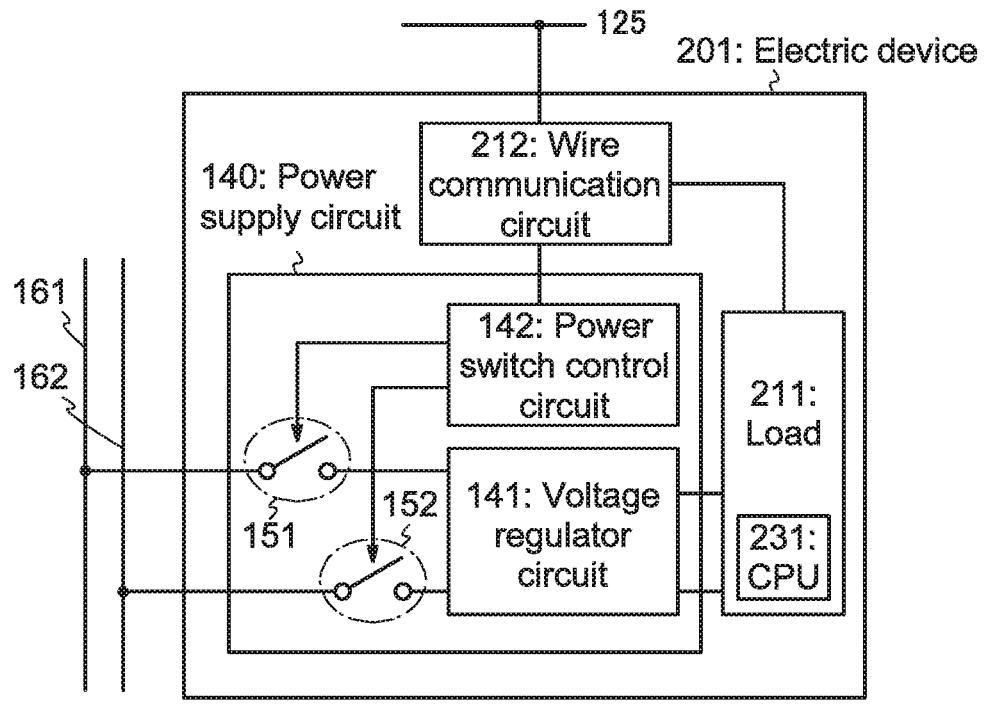
FIGS. 2A and 2B illustrate a structural example of an electric device.
Figure 2B:
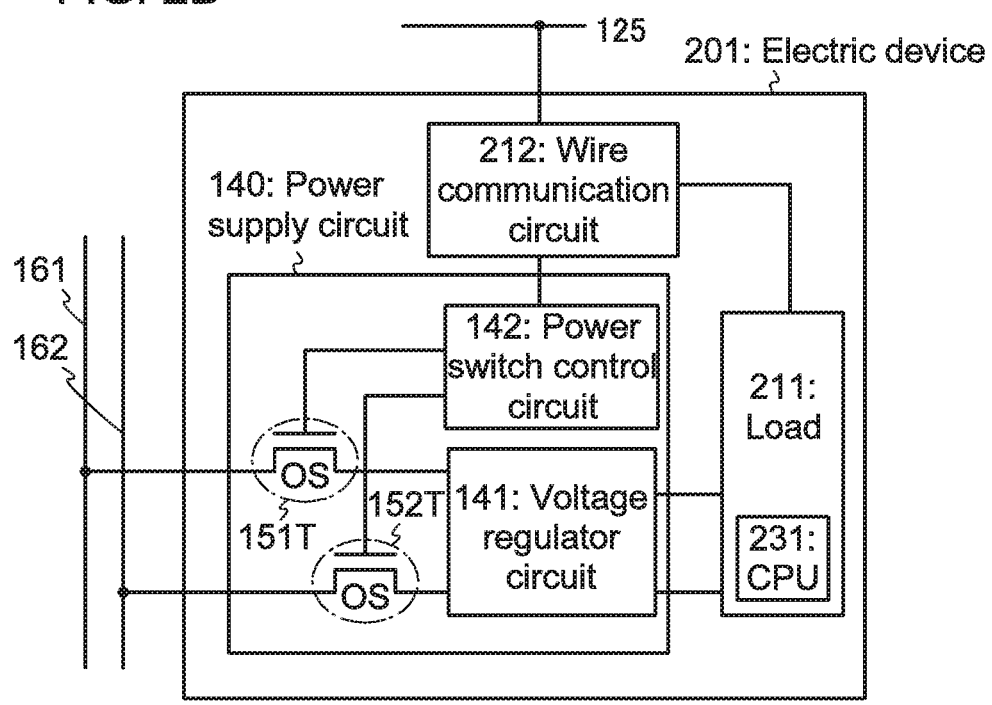

Next, as an example of operation control of the electric device 200/201 by remote control, power supply control of the electric device 200/201 by remote control is described with reference to FIGS. 2A and 2B. An electric device 201 includes at least the wire communication circuit 212 and a power supply circuit 140. Another circuit included in the electric device 201 is shown as a load 211. In FIGS. 2A and 2B, a CPU 231 is illustrated as an example of the load 211. The power supply circuit 140 includes a power switch 151, a power switch 152, a voltage regulator circuit 141, and a power switch control circuit 142.

In FIG. 2A, a first potential is supplied from a wiring 161 to the voltage regulator circuit 141 through the power switch 151, and a second potential is supplied from a wiring 162 to the voltage regulator circuit 141 through the power switch 152. The power switch 151 has a function of controlling an input of the first potential to the voltage regulator circuit 141 and the power switch 152 has a function of controlling an input of the second potential to the voltage regulator circuit 141. The power switch control circuit 142 is connected to the server 120 through the wire communication circuit 212 and controls the on/off of the power switches 151 and 152 on the basis of a control signal from the server 120.

The wire communication circuit 212 may be provided in the power switch control circuit 142 or may be provided as the electric device 201 that is different from the one illustrated in FIGS. 2A and 2B.

The power switch 151 can be provided either or both of between the wiring 161 and the voltage regulator circuit 141 and between the voltage regulator circuit 141 and the load 211. The power switch 152 can be provided either or both of between the wiring 162 and the voltage regulator circuit 141 and between the voltage regulator circuit 141 and the load 211.

One of the power switches 151 and 152 may be omitted. Further, one of the first potential and the second potential may be a ground potential.

In one embodiment of the present invention, a transistor that can withstand high voltage is used as each of the power switches 151 and 152. The transistor specifically includes a semiconductor whose band gap is larger than that of single crystal silicon for an active layer. For example, a semiconductor whose band gap is more than 1.1 eV, preferably 2.5 eV or more and 4 eV or less, further preferably 3 eV or more and 3.8 eV or less may be used for the active layer. Examples of the semiconductor whose band gap is larger than that of single crystal silicon include an oxide semiconductor, gallium nitride, and silicon carbide. A transistor including such a material for an active layer can withstand high voltage so that dielectric breakdown does not occur even when voltage between a source and a drain is higher than or equal to 100 V, preferably higher than or equal to 200 V, further preferably higher than or equal to 500 V.

In particular, a field-effect transistor including an oxide semiconductor for an active layer withstands high voltage, and moreover, the resistance (on-resistance) when the transistor is turned on (in a conducting state) is small. Thus, power loss due to the on-resistance of the transistor can be small.

In the case where silicon carbide, gallium nitride, or the like is used, it is difficult to form a field-effect transistor that withstands high voltage and has low on-resistance. Thus, for example, in the case where a switch that withstands a voltage of 4 kV or higher is formed using silicon carbide, a bipolar transistor is used. However, the bipolar transistor has a lower on/off switching speed than the field-effect transistor; thus, a period of transition from an on state to an off state or a period of transition from an off state to an on state is long. Accordingly, it is difficult to reduce power loss due to the switching. On the other hand, in the case where an oxide semiconductor is used, it is comparatively easy to form a field-effect transistor that withstands high voltage and has low on-resistance. Accordingly, the use of the field-effect transistor including an oxide semiconductor for an active layer as the power switches 151 and 152 can achieve high-speed switching of the power switches 151 and 152. Consequently, power loss due to the switching can be small.

FIG. 2B illustrates a structural example in which the power switch 151 and the power switch 152 illustrated in FIG. 2A are a transistor 151T and a transistor 152T, respectively, each of which withstands high voltage and includes an oxide semiconductor for an active layer. Gates of the transistors 151T and 152T are connected to the power switch control circuit 142.

Note that the band gap of single crystal silicon is approximately 1.1 eV, and even in a state where there is no carrier caused by a donor or an acceptor (i.e., even in the case of an intrinsic semiconductor), the concentration of thermally excited carriers is approximately $1 \times 10^{11}$ cm$^{-3}$. In contrast, the band gap of the In—Ga—Zn-based oxide semiconductor, for example, is approximately 3.2 eV and the concentration of thermally excited carriers is approximately $1 \times 10^{-7}$ cm$^{-3}$. The off resistance (resistance between a source and a drain of a transistor in an off state) of a transistor is inversely proportional to the concentration of thermally excited carriers in the channel formation region. Accordingly, the resistivity of the In—Ga—Zn-based oxide semiconductor at the time when the transistor is off is 18 orders of magnitude higher than that of single crystal silicon.

By using such a semiconductor having a wide band gap for the transistor, for example, off-state current (per unit channel width (1 μm), here) at room temperature (25° C.) is 100 zA (1 zA (zeptoampere) is $1 \times 10^{-21}$ A) or lower, preferably 10 zA or lower.

Thus, the transistors 151T and 152T each including an oxide semiconductor for the active layer can prevent supply of power to the load 211 due to off-state current. As a result, power consumption of the electric device in a non-operation state can be reduced, leading to a reduction in power consumption of the whole house 100.

When the off-state current that flows in the transistors 151T and 152T is significantly reduced, charge accumulated on the load 211 side can be held by a parasitic capacitor of the load 211. This enables the electric device to carry out a rapid return operation when the transistors 151T and 152T are turned on to resume supplying power.

Note that the power switches 151 and 152 in this embodiment are each composed of one transistor. However, the present invention is not limited to this structure and either or both of the power switch 151 and the power switch 152 may be composed of a plurality of transistors.

The voltage regulator circuit 141 has a function of regulating input voltage. Voltage regulation in the voltage regulator circuit 141 means any one or more of a conversion of alternating-current voltage into direct-current voltage, a conversion of direct-current voltage into alternating-current voltage, a change of a voltage level, and smoothing of a voltage level to obtain a constant voltage level.

In the case where the voltage regulator circuit 141 converts alternating-current voltage into direct-current voltage, for example, a rectifier circuit is provided in the voltage regulator circuit 141. In the case where the voltage regulator circuit 141 converts direct-current voltage into alternating-current voltage, a DC-AC inverter circuit is provided in the voltage regulator circuit 141. In the case where the voltage regulator circuit 141 changes a voltage level, a step up converter or a step down converter is provided in the voltage regulator circuit 141. In the case where the voltage regulator circuit 141 is used to obtain a smooth voltage level, a smoothing circuit is provided in the voltage regulator circuit 141.

In the case where alternating-current voltage is supplied from a commercial power supply to the voltage regulator circuit 141, for example, alternating-current voltage is converted into direct-current voltage by the rectifier circuit, a smooth and constant level of the direct-current voltage is obtained by the smoothing circuit, and the level of the direct-current voltage having a smooth level is decreased to a level that is required in the load 211 by the step down converter, in the voltage regulator circuit 141. The voltage regulated in the voltage regulator circuit 141 is supplied to the load 211.

Note that the voltage regulator circuit 141 may have a function of isolating the wiring 161 and the wiring 162 from the load 211 in addition to the function of voltage regulation. The voltage regulator circuit 141 can have the function of isolating the wiring 161 and the wiring 162 from the load 211 with the use of a transformer, for example.

The server 120 controls the on/off of the power switches 151 and 152 in accordance with an instruction from the portable information terminal 130. Alternatively, the on/off of the power switches 151 and 152 may be controlled in the following manner: an operation program is stored in the server 120 in advance, the operation program is started in accordance with the instruction from the portable information terminal 130, and the on/off is controlled in response to the operation program. When the operation program is stored in the server 120 in advance, the electric device 200 can be also controlled even without an instruction from the portable information terminal 130. Further alternatively, an operation program may be stored in the power switch control circuit 142 to operate the power switches 151 and 152 in response to the operation program. Note that the server 120 also has a function of transmitting operating information of the electric device 200 to the portable information terminal 130.

Figure 1B:
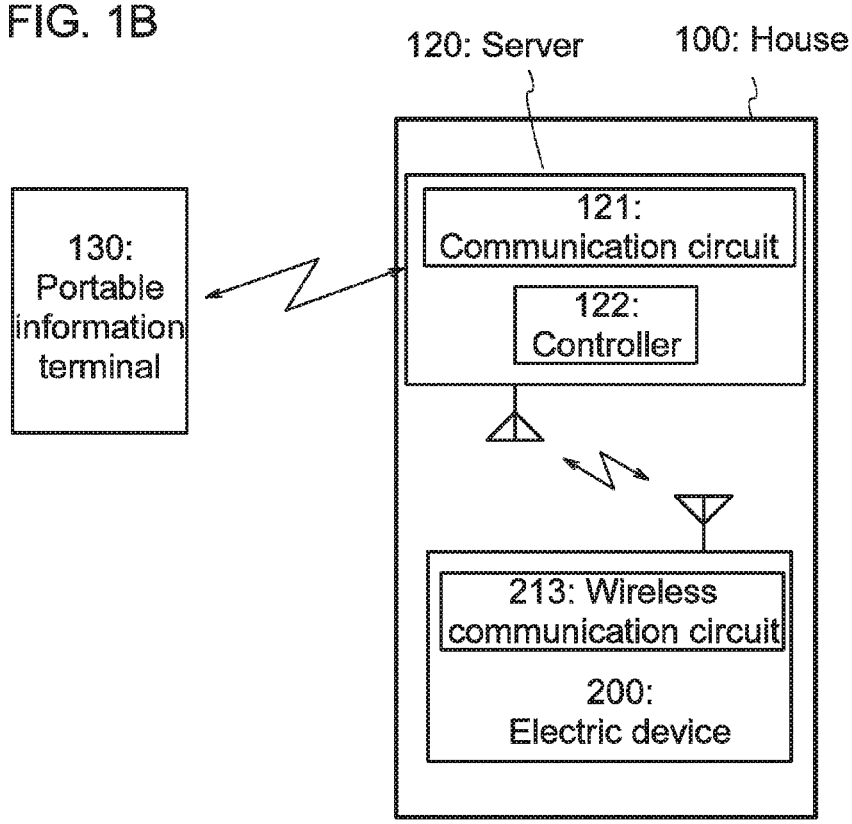

FIG. 1B is different from FIG. 1A in that a wireless LAN is used instead of the wired LAN 125. The electric device 200 illustrated in FIG. 1B includes a wireless communication circuit 213. The server 120 and the electric device 200 are connected to each other by wireless communication with the wireless communication circuit 213.

Figure 3A:
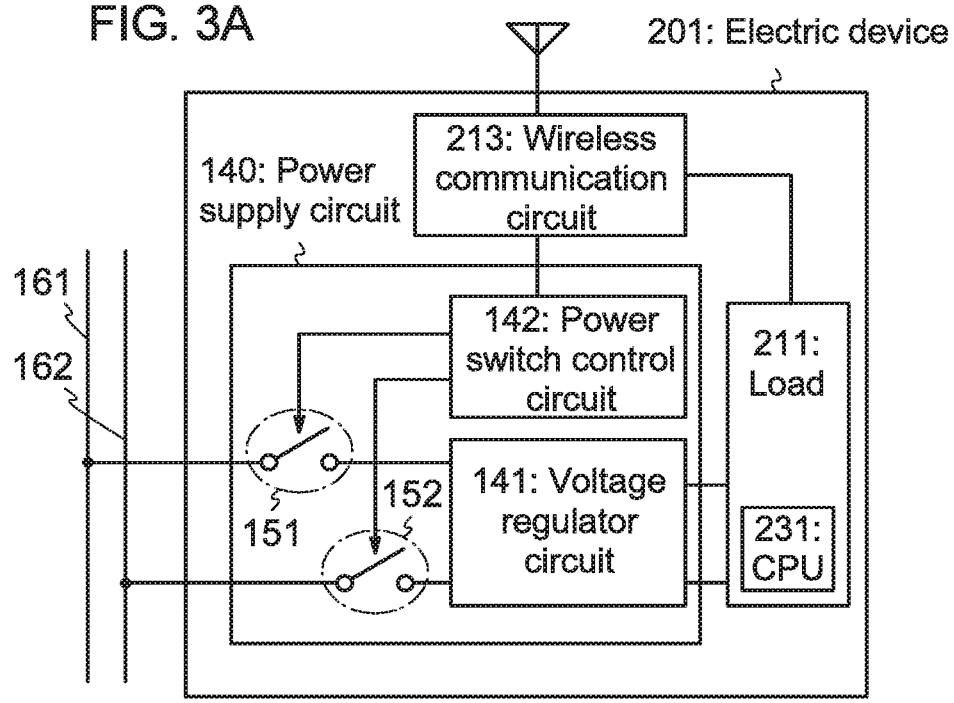
FIGS. 3A and 3B illustrate a structural example of an electric device.
Figure 3B:
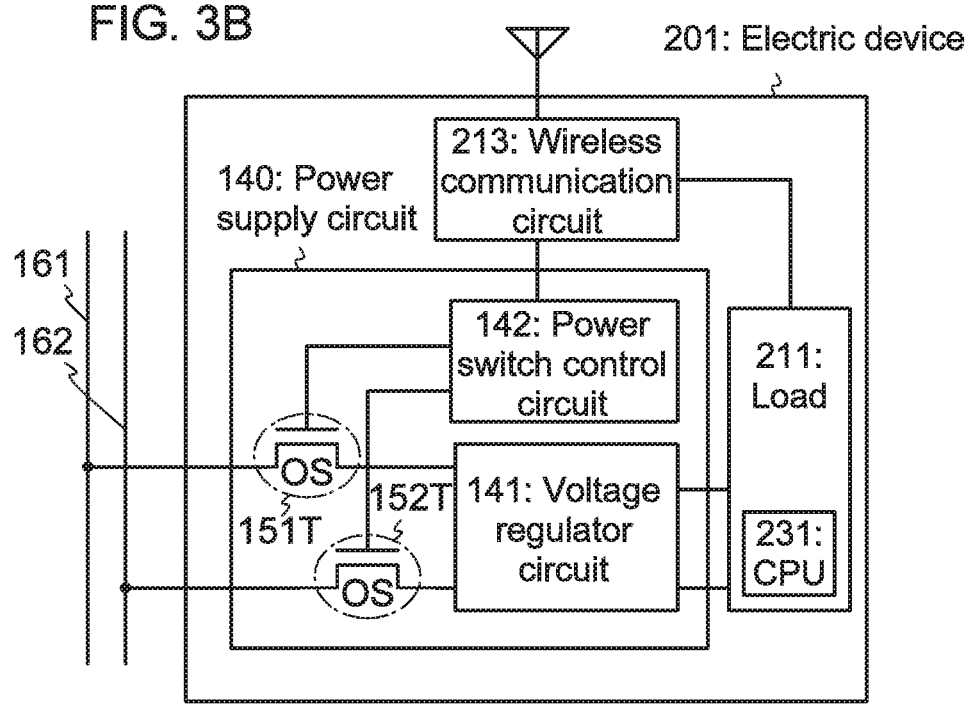

FIGS. 3A and 3B each illustrate a structural example of the electric device 200/201 connected to the server 120 through the wireless LAN. The structures in FIGS. 3A and 3B are different from those in FIGS. 2A and 2B in that the wireless communication circuit 213 is provided instead of the wire communication circuit 212. In other words, the power switch control circuit 142 is connected to the wireless communication circuit 213 in FIGS. 3A and 3B. The power switch control circuit 142 is connected to the server 120 through the wireless communication circuit 213 and controls the on/off of the power switches 151 and 152 on the basis of a control signal from the server 120.

The wireless communication circuit 213 may be provided in the power switch control circuit 142 or may be provided as the electric device 201 that is different from the one illustrated in FIGS. 3A and 3B. Since the electric device 201 is connected to the server 120 through the wireless LAN, a LAN cable does not need to be laid, which can facilitate network construction in the house 100 and a change in position of the electric device.

In the case where the server 120 is connected to the electric device 201 through the wireless LAN, the portable information terminal 130 and the electric device 201 can communicate directly with each other without through the server 120.

The electric device 201 may include a communication circuit that is different from the wire communication circuit 212 and the wireless communication circuit 213. For example, a communication circuit used for optical communication using visible light, infrared light, or the like may be included. Alternatively, a plurality of or a plurality of kinds of communication circuits may be included.

Here, a structure of the CPU 231 is described with reference to FIGS. 4A to 4C and FIG. 5. The CPU 231 includes a volatile memory unit 232 and a nonvolatile memory unit 233. In the CPU 231, data in the volatile memory unit 232 is stored in the nonvolatile memory unit 233 before supply of power from the power supply circuit 140 stops, and the data in the nonvolatile memory unit 233 is restored in the volatile memory unit 232 when supply of power resumes.

The volatile memory unit 232 includes a plurality of volatile memory elements and also includes a circuit relating to control thereof and the like. Note that access speed of the volatile memory element included in the volatile memory unit 232 is higher than at least that of a nonvolatile memory element included in the nonvolatile memory unit 233 to be described later.

A semiconductor material used for a transistor included in the volatile memory element is not particularly limited. However, the semiconductor material preferably has a band gap width different from that of a semiconductor material used for a transistor included in the nonvolatile memory element to be described later. As such a semiconductor material, for example, silicon, germanium, silicon germanium, or gallium arsenide can be used, and a single crystal semiconductor is preferably used. In order to increase the speed of processing data, it is preferable to use, for example, a transistor with high switching speed, such as a transistor formed using single crystal silicon.

The nonvolatile memory unit 233 includes a plurality of nonvolatile memory elements and also includes a circuit relating to control thereof and the like. The nonvolatile memory element is electrically connected to a node holding electric charge corresponding to data of the volatile memory element and is used for storing data from the volatile memory element in a period during which power is not supplied. Accordingly, the nonvolatile memory element included in the nonvolatile memory unit 233 has a longer data retention time than at least the volatile memory element to which power is not supplied.

Figure 4A:
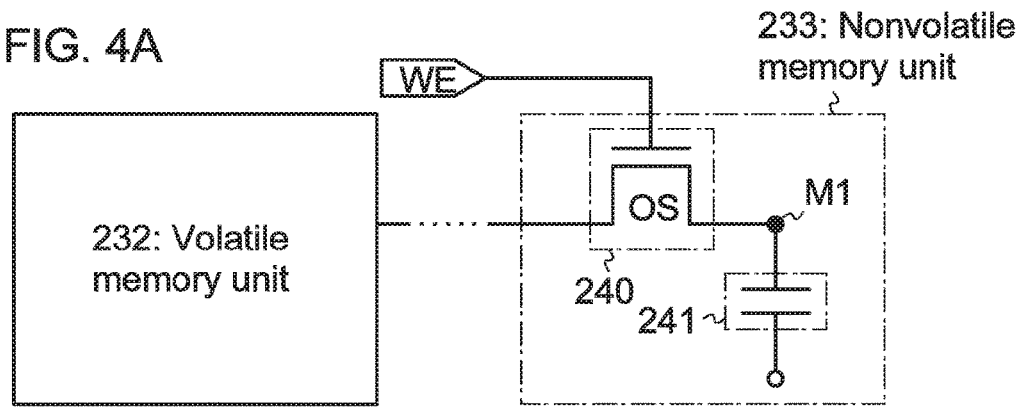
FIGS. 4A to 4C are equivalent circuit diagrams for illustrating one embodiment of the present invention.
Figure 4B:
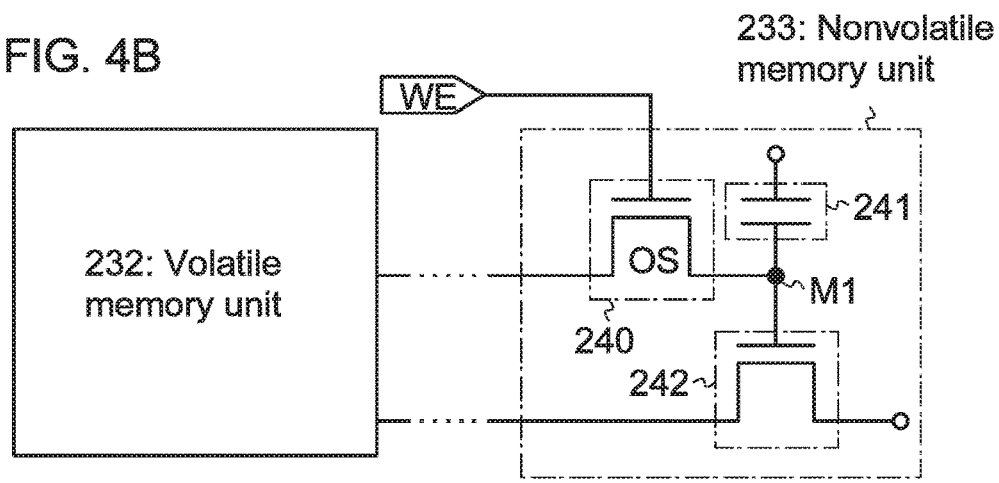
Figure 4C:
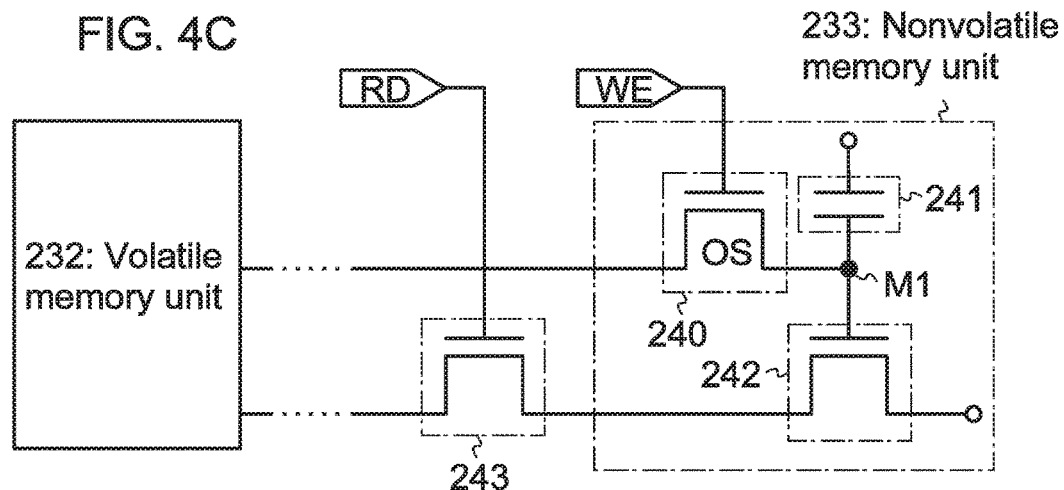

Here, structural examples of the nonvolatile memory element in the nonvolatile memory unit 233 are described using circuit diagrams in FIGS. 4A to 4C.

The nonvolatile memory unit 233 in FIG. 4A includes a transistor 240 and a capacitor 241 and is electrically connected to the volatile memory unit 232 through the transistor 240. Note that in this embodiment, the transistor 240 is an n-channel transistor; however, a p-channel transistor may be used as appropriate. In such a case, a potential supplied to a gate electrode is inverted as appropriate.

Specifically, a source electrode (or a drain electrode) of the transistor 240 is electrically connected to a node holding electric charge corresponding to data of the volatile memory unit 232. The drain electrode (or the source electrode) of the transistor 240 is electrically connected to one electrode of the capacitor 241 (hereinafter the node is referred to as a node M1 in some cases). A write control signal WE is supplied to the gate electrode of the transistor 240, and the transistor 240 is turned on or off in accordance with the potential of the write control signal WE. A predetermined potential is supplied to the other electrode of the capacitor 241. Here, the predetermined potential is, for example, a ground potential (GND). By providing the capacitor 241 in this manner, much electric charge can be held in the node M1, so that data retention characteristics can be improved. The transistor 240 preferably has extremely low off-state current. In this embodiment, a transistor which has extremely low off-state current and includes an oxide semiconductor for a semiconductor layer where a channel is formed is used as the transistor 240.

When data is stored from the volatile memory unit 232, by turning on the transistor 240 by supply of the high potential H as the write control signal WE, the potential of the node holding electric charge corresponding to data of the volatile memory unit 232 is supplied to the node M1. After that, by turning off the transistor 240 by supply of the low potential L as the write control signal WE, electric charge supplied to the node M1 is held. Here, since the off-state current of the transistor 240 is extremely low, electric charge in the node M1 is held for a long time.

When data is restored to the volatile memory unit 232, by turning on the transistor 240 by supply of the high potential H as the write control signal WE, the potential of the node M1 is supplied to the node holding electric charge corresponding to data of the volatile memory unit 232.

By using a semiconductor having a wide band gap for the transistor 240, the off-state current of the transistor 240 can be extremely low. Thus, by turning off the transistor 240, the potential of the node M1 can be held for an extremely long time. With such a structure, the nonvolatile memory unit 233 can be used as a nonvolatile memory element capable of holding data without supply of power.

As illustrated in FIG. 4B, the nonvolatile memory unit 233 may include a transistor 242 in addition to the components in FIG. 4A. A gate electrode of the transistor 242 is electrically connected to the node M1. A drain electrode (or a source electrode) of the transistor 242 is electrically connected to the node holding electric charge corresponding to data of the volatile memory unit 232. A predetermined potential is supplied to the source electrode (or the drain electrode) of the transistor 242.

In the nonvolatile memory unit 233 in FIG. 4B, the state of the transistor 242 depends on a potential held in the node M1 in the storage of data. In other words, the transistor 242 is turned on when the high potential H is supplied in the storage of data, and the transistor 242 is turned off when the low potential L is supplied in the storage of data.

In restorage of data, the potential of the drain electrode of the transistor 242 is supplied to the node holding electric charge corresponding to data of the volatile memory unit 232. In other words, when the high potential H is supplied to the node M1 in the storage of data, the transistor 242 is on, and the potential of the source electrode of the transistor 242 is supplied to the volatile memory unit 232. Further, when the low potential L is supplied to the node M1 in the storage of data, the transistor 242 is off, and the potential of the source electrode of the transistor 242 is not supplied to the volatile memory unit 232.

In order to increase the speed of reading data, it is preferable to use a transistor that is similar to the transistor used for the volatile memory element as the transistor 242.

Note that the source electrode of the transistor 242 and the other electrode of the capacitor 241 may have the same potential or different potentials. The source electrode of the transistor 242 and the other electrode of the capacitor 241 may be electrically connected to each other. Further, the capacitor 241 is not needed to be provided. For example, in the case where the parasitic capacitance of the transistor 242 is high, the parasitic capacitance can be used instead of the capacitor 241.

Here, the drain electrode of the transistor 240 and the gate electrode of the transistor 242 (i.e., the node M1) have the same effect as a floating gate of a floating-gate transistor used as a nonvolatile memory element. However, since data can be directly rewritten by turning on or off the transistor 240, injection of electric charge into a floating gate and extraction of electric charge from the floating gate with the use of high voltage are not necessary. In other words, in the nonvolatile memory unit 233, high voltage needed for writing or erasing data in a conventional floating gate transistor is not necessary. Thus, by using the nonvolatile memory unit 233 in this embodiment, power consumption needed for storage of data can be reduced.

For similar reasons, a decrease in operation speed due to data writing or data erasing can be reduced; thus, the nonvolatile memory unit 233 can operate at high speed. Further, for similar reasons, the problem of deterioration of a gate insulating film (a tunnel insulating film) that is pointed out in a conventional floating gate transistor does not exist. In other words, unlike in a conventional floating gate transistor, the nonvolatile memory unit 233 described in this embodiment has no limitation on the number of writings in principle. From the above, the nonvolatile memory unit 233 can be adequately used as a memory device that needs many rewritings and high-speed operation, such as a register.

As illustrated in FIG. 4C, the nonvolatile memory unit 233 may include a transistor 243 in addition to the components in FIG. 4B. A read control signal RD is supplied to a gate electrode of the transistor 243. A drain electrode (or a source electrode) of the transistor 243 is electrically connected to the node holding electric charge corresponding to data of the volatile memory unit 232. The source electrode (or the drain electrode) of the transistor 243 is electrically connected to the drain electrode of the transistor 242.

Here, the read control signal RD is a signal for supplying the high potential H to the gate electrode of the transistor 243 at the time of the restorage of data. In this case, the transistor 243 can be turned on. Accordingly, at the time of the restorage of data, a potential based on the on state or off state of the transistor 242 can be supplied to the node holding electric charge corresponding to data of the volatile memory unit 232.

Note that in order to increase the speed of reading data, it is preferable to use a transistor that is similar to the transistor used for the volatile memory element as the transistor 243.

Figure 5:
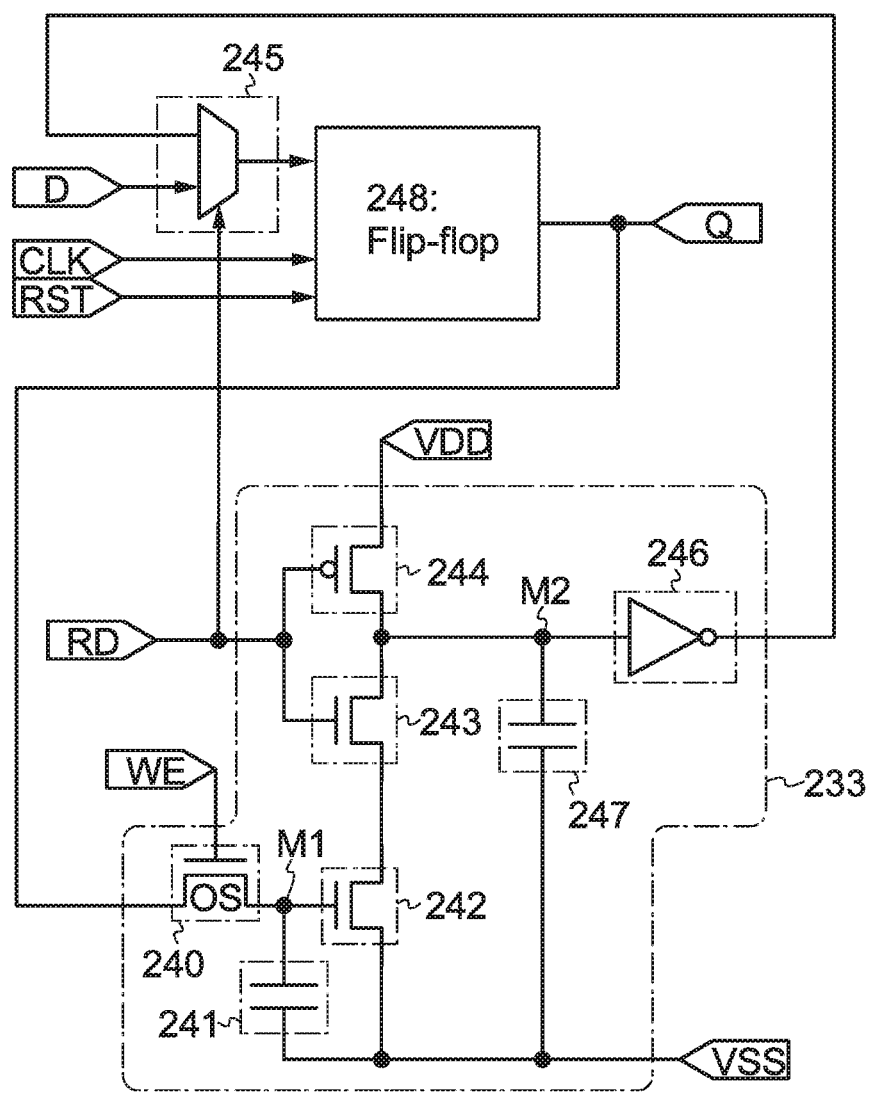
FIG. 5 is an equivalent circuit diagrams for illustrating one embodiment of the present invention.

FIG. 5 shows an example of a circuit configuration of a nonvolatile register which can hold 1-bit data and employs the structure of the nonvolatile memory unit 233 in FIG. 4C. Note that in FIG. 5, the same reference numerals are used for the same components as those in FIG. 4C.

In the circuit configuration of the register in FIG. 5, a flip-flop 248, the nonvolatile memory unit 233, and a selector 245 are included. In the register in FIG. 5, the flip-flop 248 is provided as the volatile memory unit 232 in FIG. 4C.

The flip-flop 248 is supplied with a reset signal RST, a clock signal CLK, and a data signal D. The flip-flop 248 has a function of holding data of a data signal D that is input in accordance with the clock signal CLK and outputting the data as a data signal Q.

The nonvolatile memory unit 233 is supplied with the write control signal WE, the read control signal RD, and the data signal Q.

The nonvolatile memory unit 233 has a function of storing data of an inputted data signal Q in accordance with the write control signal WE and outputting the stored data in accordance with the read control signal RD.

The selector 245 selects the data signal D or the data signal output from the nonvolatile memory unit 233 and inputs the selected signal to the flip-flop 248 in accordance with the read control signal RD.

Further, as illustrated in FIG. 5, the transistor 240 and the capacitor 241 are provided in the nonvolatile memory unit 233.

The transistor 240 is an n-channel transistor. One of a source electrode and a drain electrode of the transistor 240 is electrically connected to an output terminal of the flip-flop 248. The transistor 240 has a function of controlling holding a data signal output from the flip-flop 248 in accordance with the write control signal WE.

The transistor 240 can be a transistor which includes an oxide semiconductor and has low off-state current, as in the structure in FIG. 4C.

One of a pair of electrodes of the capacitor 241 is electrically connected to the other of the source electrode and the drain electrode of the transistor 240 (hereinafter the node is referred to as a node M1 in some cases). The low potential L is supplied to the other of the pair of electrodes of the capacitor 241. The capacitor 241 has a function of holding electric charge based on data of the stored data signal Q in the node M1. Since the off-state current of the transistor 240 is extremely low, the electric charge in the node M1 is held and thus the data is held even when supply of the power supply voltage is stopped.

A transistor 244 is a p-channel transistor. One of a source electrode and a drain electrode of the transistor 244 is supplied with the high potential H and a gate electrode of the transistor 244 is supplied with the read control signal. Here, the high potential H is a potential higher than the low potential L and the low potential L is a potential lower than the high potential H. Further, a ground potential can be used as the high potential H or the low potential L. For example, in the case where a ground potential is used as the high potential H, the low potential L is voltage lower than the ground potential, and in the case where a ground potential is used as the low potential L, the high potential H is voltage higher than the ground potential.

The transistor 243 is an n-channel transistor. One of the source electrode and the drain electrode of the transistor 243 is electrically connected to the other of the source electrode and the drain electrode of the transistor 244 (hereinafter the node is referred to as the node M1 in some cases). The gate electrode of the transistor 243 is supplied with the read control signal RD.

The transistor 242 is an n-channel transistor. One of the source electrode and the drain electrode of the transistor 242 is electrically connected to the other of the source electrode and the drain electrode of the transistor 243, and the other thereof is supplied with the low potential L.

An input terminal of an inverter 246 is electrically connected to the other of the source electrode and the drain electrode of the transistor 244. An output terminal of the inverter 246 is electrically connected to an input terminal of the selector 245.

One of a pair of electrodes of a capacitor 247 is electrically connected to the input terminal of the inverter 246, and the other thereof is supplied with the low potential L. The capacitor 247 has a function of holding electric charge based on data of a data signal input to the inverter 246.

In the register having the above-described structure in FIG. 5, when data is stored from the flip-flop 248, the transistor 240 is turned on by supply of the high potential H as the write control signal WE, so that electric charge based on data of the data signal Q in the flip-flop 248 is supplied to the node M1. After that, by turning off the transistor 240 by supply of the low potential L as the potential of the write control signal WE, electric charge supplied to the node M1 is held. While the low potential L is supplied as the potential of the read control signal RD, the transistor 243 is turned off and the transistor 244 is turned on, so that the potential of the node M2 becomes the high potential H.

When data is restored from the flip-flop 248, by supply of the high potential H as the read control signal RD, the transistor 244 is turned off and the transistor 243 is turned on, so that a potential based on the electric charge held in the node M1 is supplied to the node M2. In the case where electric charge corresponding to the high potential H of the data signal Q is held in the node M1, the transistor 242 is turned on, the low potential L is supplied to the node M2, and the high potential H is restored to the flip-flop 248 through the inverter 246. Alternatively, in the case where electric charge corresponding to the low potential L of the data signal Q is held in the node M1, the transistor 242 is turned off, the high potential H in the node M2 when the low potential L is supplied is held as the potential of the read control signal RD, and the low potential L is restored to the flip-flop 248 through the inverter 246.

By provision of the volatile memory unit 232 and the nonvolatile memory unit 233 in the CPU 231 as described above, data can be stored from the volatile memory unit 232 in the nonvolatile memory unit 233 before supply of power to the CPU 231 is stopped and data can be quickly restored from the nonvolatile memory unit 233 to the volatile memory unit 232 when the supply of power to the CPU 231 is resumed.

By storing and restoring data in such a manner, the CPU 231 does not need to be started up from a state where the volatile memory unit 232 is initialized every time the supply of power is stopped; thus, after the supply of power is resumed, the CPU 231 can start arithmetic processing relating to measurement immediately.

In the above, the structure of the nonvolatile memory unit 233 is not limited to the structures in FIGS. 4A to 4C and FIG. 5. For example, a phase change memory (PCM), a resistance random access memory (ReRAM), a magnetoresistive random access memory (MRAM), a ferroelectric random access memory (FeRAM), or a flash memory can be used.

A plurality of volatile memory elements in the volatile memory unit 232 can be included in, for example, a register such as a buffer register or a general-purpose register. A cache memory including a static random access memory (SRAM) or the like can also be provided in the volatile memory unit 232. The register and cache memory can store data in the nonvolatile memory unit 233.

This embodiment can be implemented in appropriate combination with any of the other embodiments.

Embodiment 2

In this embodiment, specific examples of the electric device 200 are described with reference to FIG. 6 and FIG. 7. The house 100 illustrated in FIG. 6 includes a plurality of electric devices 200. In this embodiment, the electric devices 200 include a lighting device 101, an air conditioner 102, a telephone 103, a refrigerator 104, a microwave oven 105, a dishwasher 106, a washing machine 107, a computer 108, an audio equipment 109, a television 110, a self-propelled vacuum cleaner 111, a charging station 112, a bathroom 113, a bathroom controller 114, an imaging device 115, and a recording device 116.

The plurality of electric devices 200 are each provided with its own IP address and connected to the server 120 through the wired LAN 125. The server 120 has a function of communicating with the electric devices 200 through the wired LAN 125 to control the operation of each of the electric devices 200 and recognize operating information of each of the electric devices 200. Further, the server 120 is connected to the portable information terminal 130 through a telecommunication line such as a telephone line or an internet line to transmit/receive information to/from the portable information terminal 130. The portable information terminal 130 can remotely control the server 120 through the telecommunication line. This means that the portable information terminal 130 can remotely control the electric device 200 through the server 120.

A telecommunication standard such as 100BASE-TX or 1000BASE-TX can be applied to the wired LAN 125. Alternatively, power line communication (PLC) may be used. Since a power line in the house 100 is used as a LAN cable in PLC system, a LAN cable does not need to be additionally laid. This can facilitate network construction in the house 100.

A particular electric device in the house 100 can be operated using the portable information terminal 130. For example, a user away from the house 100 can connect to the bathroom controller 114 through the server 120 using the portable information terminal 130 and operate the bathroom controller 114, so that the user can take a bath as soon as he/she gets home.

Further, even in the case where a user away from the house 100 remembers that he/she forgot to turn off the microwave oven 105 in the house, the user can connect to the microwave oven 105 through the server 120 using the portable information terminal 130 and stop supply of power to the microwave oven 105. As a result, a disaster such as a fire can be prevented.

Furthermore, using the portable information terminal 130, a user can operate the imaging device 115 in the house 100 through the server 120 to check inside the house 100. Note that when the imaging device 115 is set outside the house 100, the user can check outside the house 100. An image taken by the imaging device 115 can be recorded in the electric device 200 that has an image recording function, such as the imaging device 115, the server 120, the recording device 116, or the computer 108. The image taken by the imaging device 115 can be transferred to the portable information terminal 130 to be checked with the portable information terminal 130. The imaging device 115 may have a sound collection function. The sounds collected by the imaging device 115 can be recorded in the electric device 200 that has a sound recording function. The sounds collected by the imaging device 115 can be transferred to the portable information terminal 130 to be checked with the portable information terminal 130.

In addition, a user can operate the self-propelled vacuum cleaner 111 through the server 120 using the portable information terminal 130. The self-propelled vacuum cleaner 111 includes a power storage device such as a rechargeable battery or a capacitor, a motor, an aspirator, a sensor, and the like. The self-propelled vacuum cleaner 111 can clean automatically in accordance with an operation program which is set on the basis of information from the sensor. An operation instruction from the portable information terminal 130 is transmitted to the self-propelled vacuum cleaner 111 through the charging station 112. Alternatively, the operation instruction may be transmitted to the self-propelled vacuum cleaner 111 without through the charging station 112.

The self-propelled vacuum cleaner 111 includes an active radio frequency identification (RFID) tag for transmitting/receiving positional information to/from the charging station 112. In the case where the storage capacitance of the power storage device reduces to a value lower than or equal to a certain value after or during cleaning, the self-propelled vacuum cleaner 111 returns to the charging station 112, so that power is supplied from the charging station 112 to the power storage device in the self-propelled vacuum cleaner 111. Power may be supplied by direct connection of a power supply device included in the charging station 112 and the power storage device included in the self-propelled vacuum cleaner 111 or by wireless (contactless) energy transmission utilizing an electric field coupling method, an electromagnetic conduction method, a resonance method, or the like. By wireless energy transmission utilizing the resonance method, power can be supplied even when the self-propelled vacuum cleaner 111 is not close to the charging station 112; thus, power can be supplied to the self-propelled vacuum cleaner 111 during cleaning, for example.

Here, a structural example of the self-propelled vacuum cleaner 111 to which power is supplied from the charging station 112 by wireless energy transmission utilizing the electromagnetic conduction method is described with reference to FIGS. 8A and 8B. The self-propelled vacuum cleaner 111 illustrated in FIGS. 8A and 8B includes the power supply circuit 140, a power storage device 214, a communication circuit 215, and a voltage detection circuit 216. Another circuit included in the self-propelled vacuum cleaner 111 is shown as a load 211. The communication circuit 215 can communicate information using not only the above-described active RFID tag but also light or ultrasonic.

A power receiving antenna 153 of the power supply circuit 140 and a power transmitting antenna 222 of a power radiation circuit 221 can be used as antennas for communicating information, so that the self-propelled vacuum cleaner 111 and the charging station 112 can communicate with each other.

In that case, the frequency used for communication between the self-propelled vacuum cleaner 111 and the charging station 112 is different from the frequency of alternating-current power radiated from the power radiation circuit 221 for supplying power, so that the self-propelled vacuum cleaner 111 and the charging station 112 can communicate with each other through the power receiving antenna 153 and the power transmitting antenna 222 while power is supplied. Specifically, the self-propelled vacuum cleaner 111 and the charging station 112 communicate with each other by superposition of the frequency for communication, which is sufficiently lower than that for supplying power, on a signal for supplying power.

When the electrical impedance of the power radiation circuit 221 and the electrical impedance of the power supply circuit 140 are changed while power is supplied, the amplitude of alternating-current power changes so that the self-propelled vacuum cleaner 111 and the charging station 112 can communicate with each other.

Figure 8A:
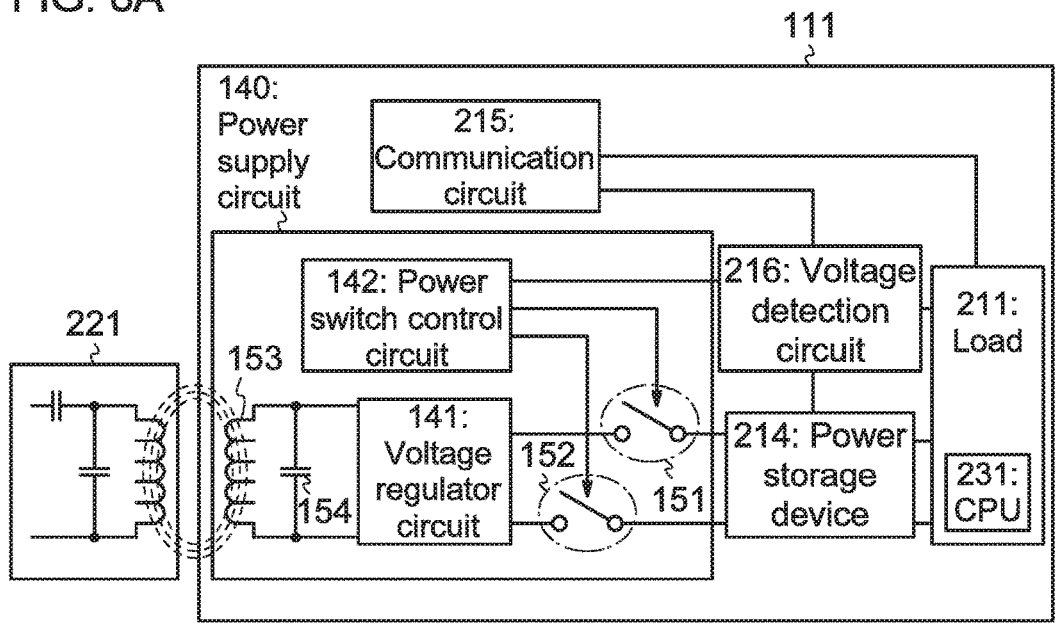
FIGS. 8A and 8B illustrate a structural example of an electric device.
Figure 8B:
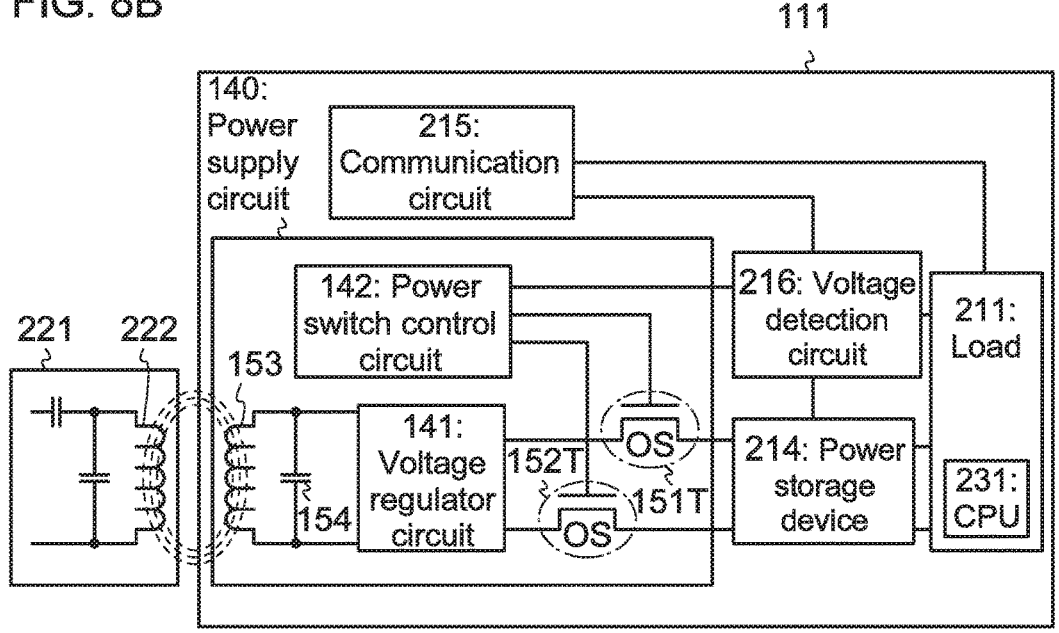

The power supply circuit 140 illustrated in FIGS. 8A and 8B includes the power switch control circuit 142, the voltage regulator circuit 141, the power switch 151, the power switch 152, the power receiving antenna 153, and a capacitor 154.

When the frequency of alternating-current power from the power radiation circuit 221 included in the charging station 112 agrees with the resonance frequency which is determined by the combination of the inductance L of the power receiving antenna 153 and the conductance C of the capacitor 154, the induced electromotive force is produced in the power receiving antenna 153 by Faraday's law of induction; thus, power can be supplied from the charging station 112 to the self-propelled vacuum cleaner 111.

The frequency of the alternating-current power from the power radiation circuit 221 is not limited to a specific frequency, and for example, any of the following frequencies can be used: 300 GHz to 3 THz as frequencies of sub-millimeter waves; 30 GHz to 300 GHz as frequencies of millimeter waves; 3 GHz to 30 GHz as frequencies of microwaves; 300 MHz to 3 GHz as frequencies of ultrashort waves; 30 MHz to 300 MHz as frequencies of ultrashort waves; 3 MHz to 30 MHz as frequencies of short waves; 300 kHz to 3 MHz as frequencies of medium waves; 30 kHz to 300 kHz as frequencies of long waves; and 3 kHz to 30 kHz as frequencies of ultra long waves.

Power from the power radiation circuit 221 is supplied to the power storage device 214 through the voltage regulator circuit 141, the power switch 151, and the power switch 152. A charging state of the power storage device 214 is monitored by the voltage detection circuit 216. The voltage detection circuit 216 and the power switch control circuit 142 are connected to each other. The voltage detection circuit 216 controls the on/off of the power switch 151 and the power switch 152 through the power switch control circuit 142 so that the power storage device 214 is not overcharged. The voltage detection circuit 216 and the communication circuit 215 are connected to each other. The power storage device 214 supplies power to the circuits composing the self-propelled vacuum cleaner 111, such as the load 211, the voltage detection circuit 216, and the communication circuit 215. The self-propelled vacuum cleaner 111 can transmit/receive information to/from the charging station 112 through the communication circuit 215. FIG. 8B illustrates a structural example in which the power switch 151 and the power switch 152 illustrated in FIG. 8A are the transistor 151T and the transistor 152T, respectively, each of which withstands high voltage and includes an oxide semiconductor for an active layer.

Figure 6:
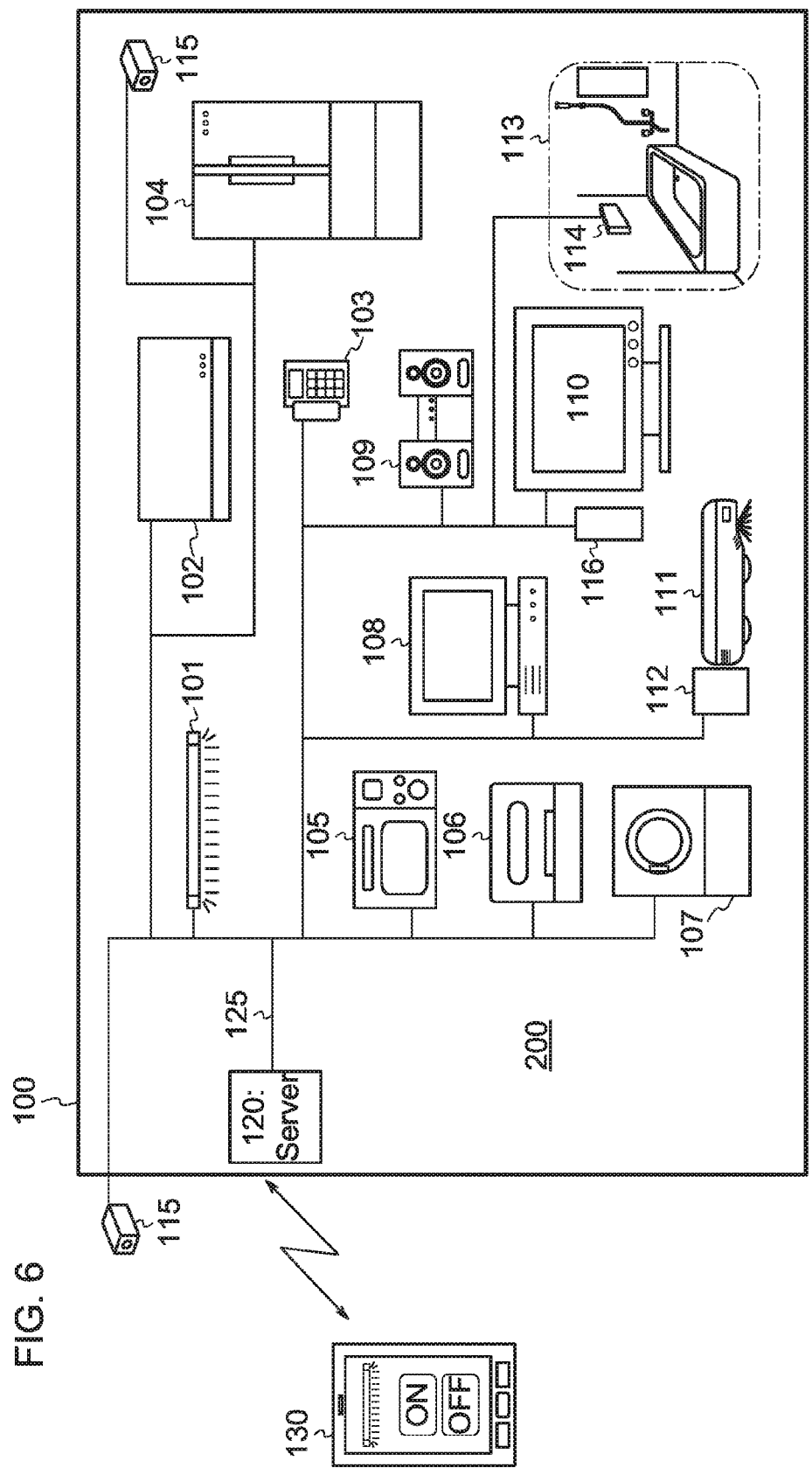
FIG. 6 illustrates a structural example of a remote control system in one embodiment of the present invention.

Next, a structure different from that in FIG. 6 is described with reference to FIG. 7. FIG. 7 is different from FIG. 6 in that a wireless LAN is used instead of the wired LAN 125. The electric devices 200 illustrated in FIG. 7 each include a wireless communication circuit 213. The server 120 and each of the electric devices 200 are connected to each other by wireless communication with the wireless communication circuit 213. The electric devices 200 are each provided with its own IP address to identify one another. Each of the electric devices 200 may also includes an RFID tag.

As a telecommunication standard for wireless communication, IEEE802.11a, IEEE802.11b, IEEE802.11g, IEEE802.11n, IEEE802.15.1, or the like can be used.

To prevent unauthorized access during wireless communication or malfunction due to interference, communicated information can be encrypted. As an encryption standard, an advanced encryption standard (AES), a temporal key integrity protocol (TKIP), a wired equivalent privacy (WEP) protocol, or the like can be used.

Note that although the server 120 is distinguished from the electric device 200 in this specification and the like, the server 120 can be considered as the electric device 200.

This embodiment can be implemented in appropriate combination with any of the other embodiments.

Embodiment 3

In this embodiment, a structure of a transistor that is applicable to the power switches 151 and 152 disclosed in the above embodiments and a method for manufacturing the transistor will be described with reference to FIGS. 9A and 9B.

Figure 9A:
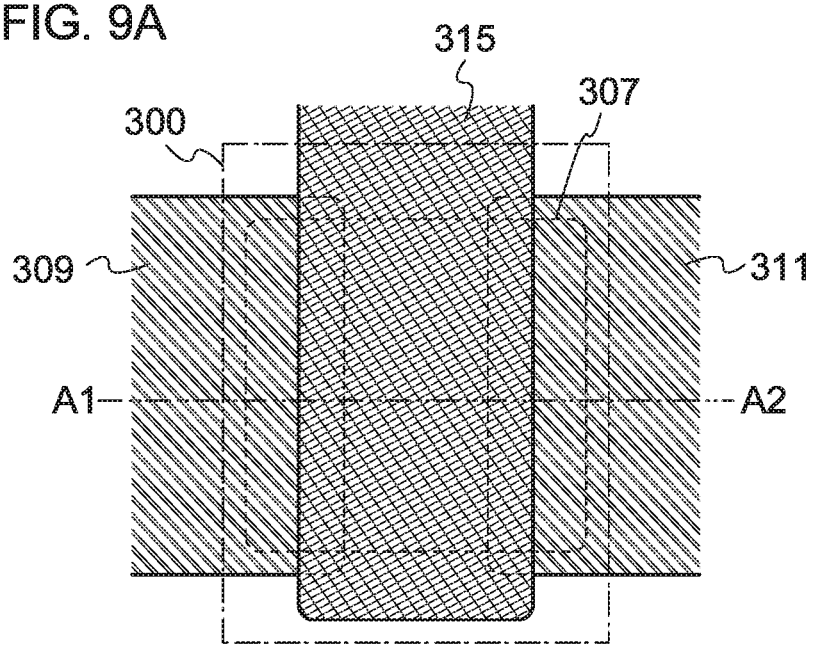
FIGS. 9A and 9B illustrate a structural example of a transistor applicable to a switch.

FIG. 9A is a top view of a transistor 300 that is applicable to the power switches 151 and 152. FIG. 9B is a cross-sectional view illustrating a stacked-layer structure taken along two-dot-dashed line A1-A2 in FIG. 9A. Note that in FIG. 9A, some components are omitted for easy understanding.

Figure 9B:
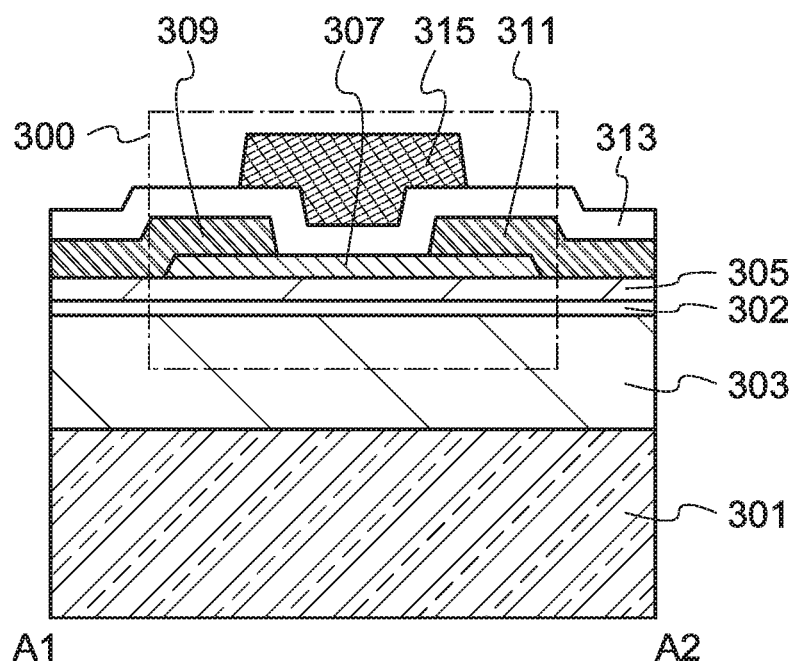

In the transistor 300 illustrated in FIGS. 9A and 9B, which is a power MOSFET, a semiconductor substrate 303 over a heat dissipation plate 301 is used as a back gate electrode, an insulating layer 302 is over the semiconductor substrate 303, a buffer layer 305 is over the insulating layer 302, and an oxide semiconductor layer 307 having a crystal structure is over the buffer layer 305. Note that the back gate electrode is positioned so that a channel formation region of the semiconductor layer is sandwiched between a gate electrode and the back gate electrode and can function like a gate electrode. By changing a potential of the back gate electrode, the threshold voltage of the transistor can be changed.

Further, a first terminal 309 and a second terminal 311 which are formed using a conductive layer are provided over the oxide semiconductor layer 307 so as to cover part of the oxide semiconductor layer 307, and an insulating layer 313 is provided so as to cover the oxide semiconductor layer 307, the first terminal 309, and the second terminal 311. Furthermore, a gate electrode 315 formed using a conductive layer is provided over the insulating layer 313 so as to overlap with at least part of each of the oxide semiconductor layer 307, the first terminal 309, and the second terminal 311.

It is necessary that the semiconductor substrate 303 have at least heat resistance high enough to withstand heat treatment (900° C. or higher) which is performed later. As the semiconductor substrate 303, a single crystal silicon substrate, a SiC substrate, a GaN substrate, a GaAs substrate, or the like is used. Alternatively, a compound semiconductor substrate of silicon germanium or the like or an SOI substrate may be used as the semiconductor substrate 303. In this embodiment, a single crystal silicon substrate is used as the semiconductor substrate 303.

The insulating layer 302 can be formed as a single layer or a stack of layers using any of the following materials: silicon oxide obtained by thermal oxidation or the like using hydrogen chloride or the like; silicon oxide obtained by a plasma chemical vapor deposition (CVD) method, a sputtering method, or the like; an oxynitride insulator such as silicon oxynitride or aluminum oxynitride; a nitride oxide insulator such as silicon nitride oxide; and the like. In the case where the insulating layer 302 is formed as a stack of layers using any of the above materials, the stack of layers may be formed using the same material or may be formed using different materials. Note that "nitride oxide" means that the nitrogen content is higher than the oxygen content whereas "oxynitride" means that the oxygen content is higher than the nitrogen content.

A silicon nitride film may be formed as the insulating layer 302 by a plasma CVD method or the like. Note that in the case of using a silicon nitride film, it is preferable to use a silicon nitride film from which hydrogen or a hydrogen compound is hardly released by heat treatment after film formation, such as a silicon nitride film formed using a mixed gas of silane ($SiH_4$), nitrogen ($N_2$), and ammonia ($NH_3$) as a supply gas. In this embodiment, silicon oxide which is obtained by thermal oxidation is used for the insulating layer 302.

To prevent silicon and chlorine from entering the oxide semiconductor layer 307, the buffer layer 305 is provided between the semiconductor substrate 303 and the oxide semiconductor layer 307. Further, the buffer layer 305 is provided between the oxide semiconductor layer 307 and the insulating layer 302 on a surface of the semiconductor substrate 303.

The buffer layer 305 can be formed as a single layer or a stack of layers using any of gallium oxide, indium gallium oxide, hafnium oxide, yttrium oxide, aluminum oxide, and the like. The buffer layer 305 preferably formed using a material containing the same kind of component as one contained in the oxide semiconductor layer 307, which is formed over and in contact with the buffer layer 305. Such a material is compatible with the oxide semiconductor, and thus, the use of such a material for a layer in contact with the oxide semiconductor enables a state of the interface between the semiconductor layer and the layer to be kept well. Here, containing "the same kind of component as one contained in the oxide semiconductor" means containing one or more of elements selected from constituent elements of the oxide semiconductor. For example, in the case where the oxide semiconductor layer 307 is formed using an In—Ga—Zn-based oxide semiconductor material, gallium oxide, gallium oxide zinc, indium gallium oxide, and the like are given as an insulating material containing the same kind of component as one contained in the oxide semiconductor.

In the case where the buffer layer 305 is formed as a stack of layers, a stacked-layer structure of a layer a and a layer b may be employed. The layer a is formed using an insulating material containing the same kind of component as one contained in the oxide semiconductor layer 307 which is in contact with the buffer layer 305, and the layer b is formed using a material that is different from the material of the layer a. Alternatively, the buffer layer 305 may be formed using an In—Ga—Zn-based oxide film which is formed using a target containing In, Ga, and Zn at an atomic ratio of 1:3:2.

The oxide semiconductor layer 307 having a crystal structure can be formed using an oxide containing at least In and containing a metal element M (M is Ga, Hf, Zn, Mg, Sn, or the like), e.g., a two-component metal oxide such as an In—Zn-based oxide, an In—Mg-based oxide, or an In—Ga-based oxide; a three-component metal oxide such as an In—Ga—Zn-based oxide (also referred to as IGZO), an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, or an In—Sn—Hf—Zn-based oxide.

The oxide semiconductor layer 307 is not limited to a single layer and may be multilayered; a stack of layers having different compositions may be used. When a stack of layers having different compositions is used as the oxide semiconductor layer 307, one layer serves as a crystal nucleus to promote crystallization of another layer. For example, a two-layer structure may be used, in which an In—Ga—Zn-based oxide film formed using a target containing In, Ga, and Zn at an atomic ratio of 1:1:1 is stacked over an In—Ga—Zn-based oxide film formed using a target containing In, Ga, and Zn at an atomic ratio of 3:1:2. When this two-layer structure is subjected to heat treatment, the two layers both become films having high crystallinity to form a stack of films having the same crystal structure, i.e., c-axis aligned crystalline oxide semiconductor (CAAC-OS) films. Alternatively, a three-layer structure may be used, in which an In—Ga—Zn-based oxide film formed using a target containing In, Ga, and Zn at an atomic ratio of 3:1:2 is formed over an In—Ga—Zn-based oxide film formed using a target containing In, Ga, and Zn at an atomic ratio of 1:1:1 and then an In—Ga—Zn-based oxide film formed using a target containing In, Ga, and Zn at an atomic ratio of 1:1:1 is stacked thereover.

A structure of an oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In the case where oxygen is included in the CAAC-OS film, nitrogen may be substituted for part of oxygen included in the CAAC-OS film. The c-axes of individual crystalline portions included in the CAAC-OS film may be aligned in one direction (e.g., a direction perpendicular to a surface of a substrate over which the CAAC-OS film is formed or a surface of the CAAC-OS film). Alternatively, the normals of the a-b planes of the individual crystalline portions included in the CAAC-OS film may be aligned in one direction (e.g., a direction perpendicular to a surface of a substrate over which the CAAC-OS film is formed or a surface of the CAAC-OS film).

Note that, among crystal parts in the CAAC-OS film, the directions of the a-axis and the b-axis of one crystal part may be different from those of another crystal part. In this specification, a term "perpendicular" indicates that the angle formed between two straight lines is greater than or equal to 80° and less than or equal to 100°, and accordingly includes the case where the angle is greater than or equal to 85° and less than or equal to 95°. In addition, a term "parallel" indicates that the angle formed between two straight lines is greater than or equal to −10° and less than or equal to 10°, and accordingly also includes the case where the angle is greater than or equal to −5° and less than or equal to 5°.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

In a transistor using the CAAC-OS film, change in electric characteristics due to irradiation with visible light or ultraviolet light is small. Thus, the transistor has high reliability.

Note that an oxide semiconductor film may be a stacked film including two or more films of an amorphous oxide semiconductor film, a microcrystalline oxide semiconductor film, and a CAAC-OS film, for example.

The thickness of the oxide semiconductor layer 307 is set so that a depletion layer spreads in a channel region and the transistor 300 can be turned off when negative voltage is applied between the gate electrode 315 and the semiconductor substrate 303 serving as a back gate electrode.

The first terminal 309 and the second terminal 311 can be formed using a metal element selected from aluminum, chromium, copper, tantalum, titanium, molybdenum, and tungsten; an alloy containing any of these metal elements as a component; an alloy containing these metal elements in combination; or the like. Further, one or more metal elements selected from manganese, magnesium, zirconium, and beryllium may be used. In addition, the first terminal 309 and the second terminal 311 may have a single-layer structure or a stacked-layer structure of two or more layers. For example, a single-layer structure of an aluminum layer containing silicon, a two-layer structure in which a titanium layer is stacked over an aluminum layer, a two-layer structure in which a titanium layer is stacked over a titanium nitride layer, a two-layer structure in which a tungsten layer is stacked over a titanium nitride layer, a two-layer structure in which a tungsten layer is stacked over a tantalum nitride layer, a three-layer structure in which a titanium layer, an aluminum layer, and a titanium layer are stacked in this order, and the like can be given. Alternatively, a layer, an alloy layer, or a nitride layer, which contains aluminum and one or more elements selected from titanium, tantalum, tungsten, molybdenum, chromium, neodymium, and scandium may be used.

The first terminal 309 and the second terminal 311 can be formed using a light-transmitting conductive material such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added. It is also possible to use a stacked-layer structure formed using the above light-transmitting conductive material and the above metal element.

The insulating layer 313 can be formed as a single layer or a stack of layers using any of the following materials: silicon oxide obtained by a plasma CVD method, a sputtering method, or the like; an oxide insulator such as aluminum oxide; an oxynitride insulator such as silicon oxynitride or aluminum oxynitride; a nitride oxide insulator such as silicon nitride oxide; and the like. In the case where the insulating layer 313 is formed as a stack of layers using any of the above materials, the stack of layers may be formed using the same material or may be formed using different materials. Note that a second buffer layer may be provided between the insulating layer 313 and the oxide semiconductor layer 307. The second buffer layer can be formed using a material which can be used for the buffer layer 305, as appropriate.

The gate electrode 315 can be formed using a metal material selected from aluminum (Al), chromium (Cr), copper (Cu), tantalum (Ta), titanium (Ti), molybdenum (Mo), tungsten (W), neodymium (Nd), and scandium (Sc); an alloy material containing the above metal element; a nitride material of the above metal element; or the like. Further, one or more metal elements selected from manganese (Mn), magnesium (Mg), zirconium (Zr), and beryllium (Be) may be used. Alternatively, a semiconductor typified by polycrystalline silicon including an impurity element such as phosphorus, or silicide such as nickel silicide may be used.

Further, the gate electrode 315 may have a single-layer structure or a stacked-layer structure of two or more layers. Examples thereof are a single-layer structure using aluminum containing silicon, a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film; a two-layer structure in which a copper film is stacked over a Cu—Mg—Al alloy film; a three-layer structure in which a titanium nitride film, a copper film, and a tungsten film are stacked in this order; and a three-layer structure in which a tungsten film, a copper film, and a titanium nitride film are stacked in this order. With the gate electrode 315 formed using copper, wiring resistance of the gate electrode 315 and wiring resistance of a wiring formed using the same layer as the gate electrode 315 can be reduced. Further, a copper film is stacked with a film of a refractory metal such as tungsten, molybdenum, and tantalum, or a nitride film of the metal, whereby diffusion of copper to another layer can be prevented.

The gate electrode 315 can be formed using a conductive material containing oxygen such as an indium tin oxide, an indium oxide containing tungsten oxide, an indium zinc oxide containing tungsten oxide, an indium oxide containing titanium oxide, an indium tin oxide containing titanium oxide, an indium zinc oxide, or an indium tin oxide to which silicon oxide is added. It is also possible to use a stacked-layer structure formed using the above conductive material containing oxygen and a material containing the above metal element.

Since the transistor 300 illustrated in FIGS. 9A and 9B includes the oxide semiconductor layer 307 having a crystal structure for the channel region, the transistor 300 can withstand high voltage, and on-state resistance can be reduced and a large amount of current can flow.

A method for manufacturing the transistor 300 illustrated in FIG. 9A will be described below.

The insulating layer 302 is formed over the semiconductor substrate 303 serving as a back gate electrode. In this embodiment, the surface of the semiconductor substrate 303 is oxidized by thermal oxidation using hydrogen chloride and oxygen to form the insulating layer 302. Alternatively, the insulating layer 302 may be formed by a high-density plasma CVD method using microwaves (e.g., a frequency of 2.45 GHz) so as to be dense, be less likely to be dielectrically broken down, and have high quality.

Next, the buffer layer 305 is formed by a sputtering method, a CVD method, a coating method, a pulsed laser deposition method, or the like. For the buffer layer 305, a material capable of blocking the diffusion of impurities contained in the semiconductor substrate 303 or the insulating layer 302, typified by a material containing gallium, is used.

In the above structure, the semiconductor substrate 303 is a single crystal silicon substrate and the insulating layer 302 is a silicon oxide film formed by thermal oxidation. The buffer layer 305 is provided between the insulating layer 302 and the oxide semiconductor layer 307 in this embodiment; thus, even when hydrogen chloride is used in thermal oxidation for forming the insulating layer 302, the buffer layer 305 can prevent chlorine contained in the insulating layer 302 from being diffused. When the oxide semiconductor layer is formed by a sputtering method directly on the insulating layer 302 formed using silicon oxide, silicon contained in the insulating layer 302 might enter the oxide semiconductor layer at the time of sputtering; however, the buffer layer 305 can prevent silicon from entering the oxide semiconductor layer. The entry of impurities such as silicon into the oxide semiconductor layer inhibits crystallization; thus, impurities are preferably prevented from entering as much as possible.

Next, the oxide semiconductor layer 307 having a crystal structure is formed over the buffer layer 305.

The oxide semiconductor layer 307 is preferably the one having a crystal structure right after deposition, which is obtained by deposition by a sputtering method while the substrate is heated. Specifically, the substrate temperature during the deposition is higher than or equal to 100° C. and lower than or equal to 740° C., preferably higher than or equal to 200° C. and lower than or equal to 500° C.

When the substrate temperature is higher than or equal to 200° C., fine sputtering particles fly from a sputtering target, and a film is formed so that the sputtering particles adhere onto the deposition-target substrate. Further, the sputtering particles are rearranged because the substrate is heated. Thus, a dense oxide semiconductor layer is formed.

Further, heat treatment at a temperature higher than or equal to 200° C. may be performed after the deposition of the oxide semiconductor layer, so that a denser layer is obtained. However, in that case, oxygen vacancies might be generated when impurity elements (e.g., hydrogen and water) in the oxide semiconductor layer are reduced. Thus, before the heat treatment is performed, an insulating layer containing excess oxygen is preferably provided over or below the oxide semiconductor layer, in which case oxygen vacancies in the oxide semiconductor layer can be reduced by the heat treatment.

If the substrate temperature is set at 400° C. or higher to make the oxide semiconductor layer to have high density, later heat treatment at 900° C. or higher does not generate peeling or the like. Note that in the case where the oxide semiconductor layer has an amorphous structure right after the deposition, the oxide semiconductor layer can be changed to have a crystal structure by performing heat treatment thereon in a later step.

For the deposition of the CAAC-OS, the following conditions are preferably used.

By a reduction in impurity concentration in the oxide semiconductor layer which is to be formed, the crystal state can be prevented from being broken by the impurities. For example, a reduction in impurity (e.g., hydrogen, water, carbon dioxide, and nitrogen) which exists in the deposition chamber is favorable. Furthermore, impurities in a sputtering gas may be reduced. Specifically, a sputtering gas whose dew point is −80° C. or lower, preferably −100° C. or lower is used.

Further, it is preferable that the proportion of oxygen in the sputtering gas be increased and the power be optimized in order to reduce plasma damage to a formation surface at the time of sputtering. The proportion of oxygen in the sputtering gas is 30 vol % or higher, preferably 100 vol %.

Here, an In—Ga—Zn-based oxide target is described as an example of the sputtering target. A polycrystalline In—Ga—Zn-based oxide target can be made as the In—Ga—Zn-based oxide target by mixing $InO_X$ powder, $GaO_Y$ powder, and $ZnO_Z$ powder in a predetermined ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

After the oxide semiconductor layer 307 having a crystal structure is formed over the buffer layer 305, heat treatment is performed at a temperature higher than or equal to 900° C. and lower than or equal to 1500° C. in a vacuum atmosphere, a nitrogen atmosphere, an oxygen atmosphere, or a mixed atmosphere of nitrogen and oxygen. With the heat treatment at a temperature higher than or equal to 900° C. and lower than or equal to 1500° C., density and crystallinity which are in substantially the same level as those of a single crystal of an oxide semiconductor can be obtained.

In this embodiment, a CAAC-OS film is formed at a substrate temperature of 400° C. using an In—Ga—Zn-based oxide which is formed using a target containing In, Ga, and Zn at an atomic ratio of 1:1:1, and is then subjected to heat treatment at 950° C. Even after the heat treatment, in the oxide semiconductor layer 307, a c-axis is aligned in a direction parallel to a normal vector of a surface where the oxide semiconductor layer is formed or a normal vector of a surface of the oxide semiconductor film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis.

Note that when the buffer layer 305 is exposed to a clean room atmosphere after the formation and then the oxide semiconductor layer is formed, boron contained in the clean room atmosphere might be mixed at the interface between the buffer layer 305 and the oxide semiconductor layer. Thus, it is preferable that the oxide semiconductor layer be formed without exposure of the buffer layer 305 to the atmosphere after the formation. Both of them can be formed by a sputtering method and can be successively formed simply by changing targets.

Next, a resist is formed by a photolithography process over the oxide semiconductor layer, and the oxide semiconductor layer is etched using the resist as a mask. Thus, the island-shaped oxide semiconductor layer 307 is formed. The island-shaped oxide semiconductor layer 307 is formed so as to have a tapered side surface. Note that the taper angle between the side surface of the oxide semiconductor layer 307 having a crystal structure and the surface of the semiconductor substrate is greater than or equal to 10° and less than or equal to 70°.

Note that a process in which a resist mask having an appropriate shape is formed over a conductive layer or an insulating layer by a photolithography method is referred to as a photolithography process; in general, after the formation of the resist mask, an etching step and a separation step of the resist mask are performed in many cases. Thus, unless otherwise specified, a photolithography process in this specification includes a step of forming a resist mask, a step of etching a conductive layer or an insulating layer, and a step of removing the resist mask.

Next, a conductive layer is formed over the oxide semiconductor layer 307 by a sputtering method, a CVD method, an evaporation method, or the like, and the first terminal 309 serving as a source electrode, the second terminal 311 serving as a drain electrode, and a wiring or an electrode formed using the same layer as the first terminal 309 and the second terminal 311 are formed by a photolithography process. When the first terminal 309 and the second terminal 311 are formed by a printing method, an inkjet method, or the like, the number of steps can be reduced.

Then, the insulating layer 313 is formed over the oxide semiconductor layer 307, the first terminal 309, and the second terminal 311. In this embodiment, silicon oxide is used for the insulating layer 313.

After that, the gate electrode 315 is formed over the insulating layer 313 as follows: after a conductive layer is formed over the insulating layer 313 by a sputtering method, a CVD method, an evaporation method, or the like, the gate electrode 315 and a wiring or an electrode formed using the same layer as the gate electrode 315 are formed by a photolithography process. In this embodiment, a stack of a tantalum nitride film and a tungsten film is used as the conductive layer used for forming the gate electrode 315.

Through the above steps, the transistor 300 including the island-shaped oxide semiconductor layer 307 having a crystal structure for the channel region can be manufactured. Lastly, the transistor 300 is fixed to the heat dissipation plate 301.

Figure 11:
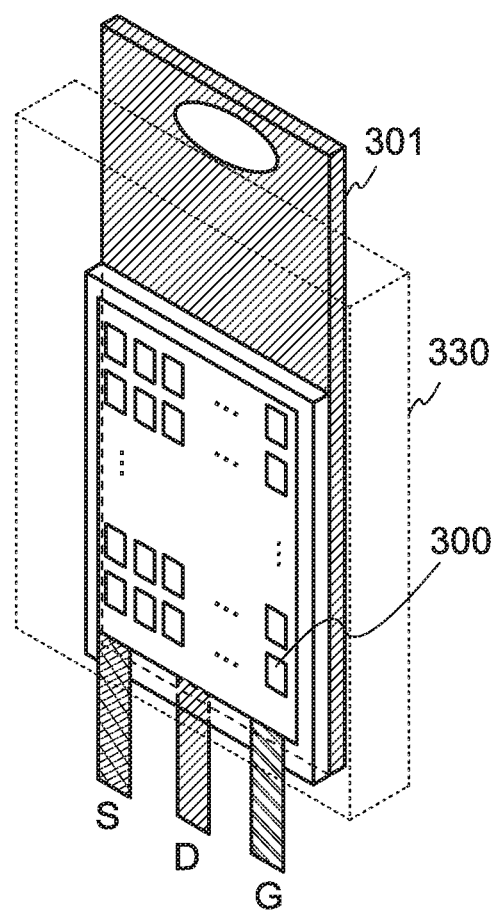
FIG. 11 is a perspective view for illustrating one embodiment of the present invention.

Note that the heat dissipation plate 301 can dissipate more heat when extending to the outside. For example, the heat dissipation plate 301 over which a plurality of transistors 300 are provided is fixed to a housing 330 as illustrated in a perspective view of FIG. 11, and the heat dissipation plate 301 extends to the outside of the housing 330.

The housing 330 can include a terminal S, a terminal D, and a terminal G for connecting the transistor 300 to an external element. The terminal S, the terminal D, and the terminal G are connected to the first terminal 309, the second terminal 311, and the gate electrode 315 of the transistor 300, respectively, for example. Alternatively, the heat dissipation plate 301 can be connected to the terminal S to be used as the terminal S, for example.

Figure 10:
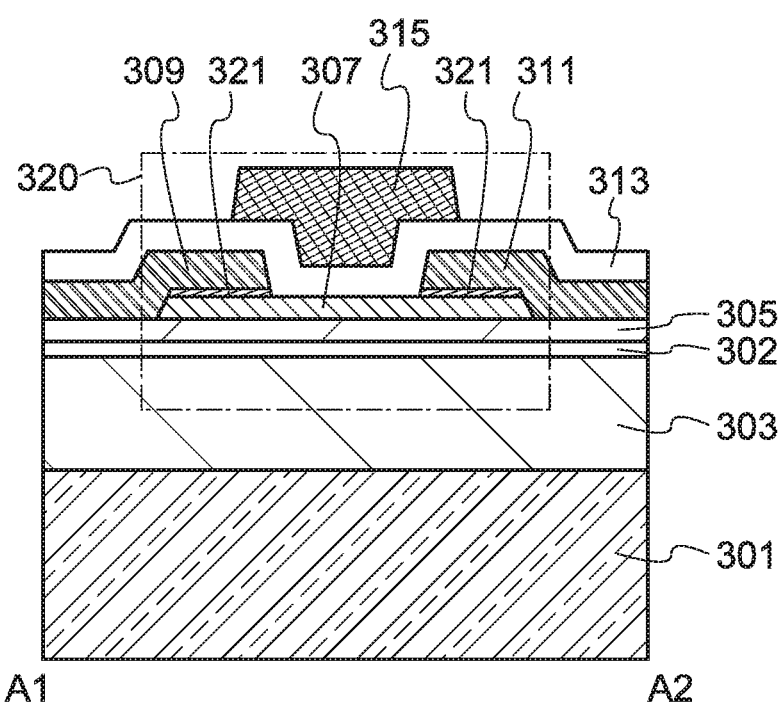
FIG. 10 illustrates a structural example of a transistor applicable to a switch.

FIG. 10 illustrates an example of a cross-sectional structure of a transistor 320 which includes an n-type region 321 over the oxide semiconductor layer 307.

In the transistor 320 illustrated in FIG. 10, the n-type regions 321 are oxide semiconductor layers containing phosphorus, boron, or nitrogen and having a crystal structure. Contact resistance is lowered by formation of the n-type regions 321 between the first terminal 309 and the oxide semiconductor layer 307 and between the second terminal 311 and the oxide semiconductor layer 307.

Steps up to the step of forming the buffer layer 305 are the same; thus, steps after the step of forming the buffer layer 305 are described. After the formation of the oxide semiconductor layer having a crystal structure, an impurity element such as phosphorus, boron, or nitrogen is added to a region near a surface of the oxide semiconductor layer by plasma treatment or an ion implantation method. The region to which the impurity element is added tends to be an amorphous region. Note that it is preferable that a crystal part remain under the region to which the impurity element is added. After the impurity element is added, heat treatment is performed at a temperature higher than or equal to 900° C. and lower than or equal to 1500° C. in a vacuum atmosphere, a nitrogen atmosphere, an oxygen atmosphere, or a mixed atmosphere of nitrogen and oxygen. This heat treatment can crystallize the region to which the impurity element is added.

Next, a resist is formed by a photolithography method over the oxide semiconductor layer to which the impurity element is added, and the oxide semiconductor layer is etched using the resist as a mask. Thus, the island-shaped oxide semiconductor layer is formed.

After that, a conductive layer which is to be the first terminal 309 and the second terminal 311 is formed and selectively etched by a photolithography process to form the first terminal 309 and the second terminal 311. Then, the region to which the above impurity element is added is selectively removed using the first terminal 309 and the second terminal 311 as masks. Thus, the n-type regions 321 can be formed under the first terminal 309 and the second terminal 311.

After that, the insulating layer 313 is formed over the oxide semiconductor layer 307, the first terminal 309, and the second terminal 311.

Next, the gate electrode 315 is formed over the insulating layer 313.

Through the above steps, the transistor 320 including the oxide semiconductor layer 307 having a crystal structure for the channel region can be manufactured. Lastly, the transistor 320 is fixed to the heat dissipation plate 301.

This embodiment can be implemented in appropriate combination with any of the other embodiments.

Embodiment 4

In this embodiment, a structural example of a semiconductor device that is applicable to the nonvolatile memory unit 233 will be described.

Figure 12A:
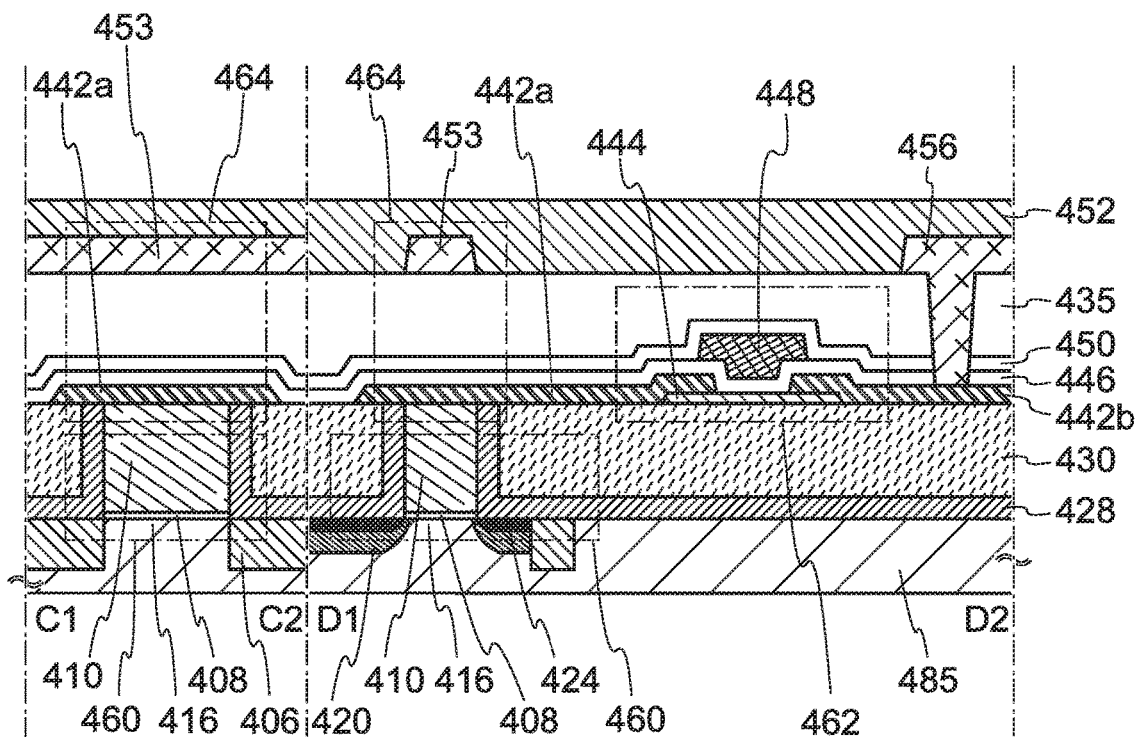
FIGS. 12A to 12C illustrate a structural example of a semiconductor device.
Figure 12B:
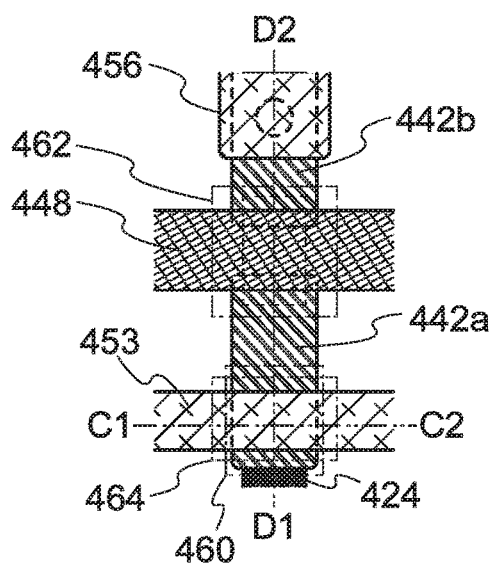
Figure 12C:
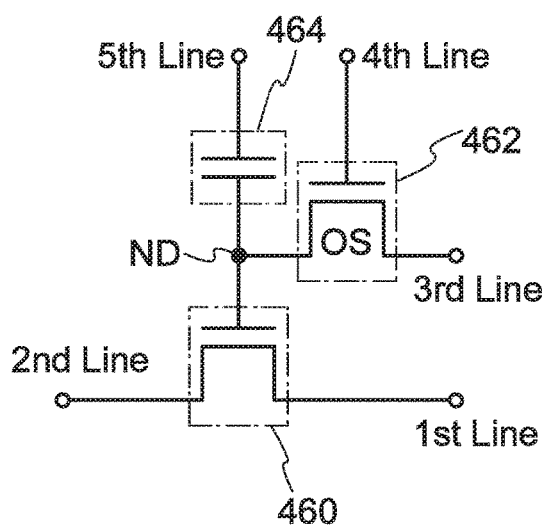

FIGS. 12A to 12C illustrate a structural example of a semiconductor device that is applicable to the nonvolatile memory unit 233. FIG. 12A is a cross-sectional view of the semiconductor device, FIG. 12B is a plan view of the semiconductor device, and FIG. 12C is a circuit diagram of the semiconductor device. The cross-sectional view in FIG. 12A illustrates a stacked-layer structure of a portion taken along two-dot-dashed lines C1-C2 and D1-D2 in FIG. 12B. Note that in FIG. 12B, some components are omitted for easy understanding.

The semiconductor device illustrated in FIGS. 12A and 12B includes a transistor 460 including a first semiconductor material in a lower portion, and a transistor 462 including a second semiconductor material and a capacitor 464 in an upper portion. In this embodiment, an example in which single crystal silicon is used as the first semiconductor material and an oxide semiconductor is used as the second semiconductor material will be described.

Note that the transistor 460, the transistor 462, and the capacitor 464 in this embodiment correspond to the transistor 242, the transistor 240, and the capacitor 241, respectively, described in the above embodiment. The transistor 462 can be formed using a structure and a manufacturing method similar to those of the transistor 300 or the transistor 320 described in the above embodiment.

Although all the transistors are described as n-channel transistors here, it is needless to say that p-channel transistors can be used. Further, the specific structure of the transistor is not limited to the one disclosed herein.

The transistor 460 in FIG. 12A includes a channel formation region 416 in a substrate 485 containing a semiconductor material (single crystal silicon in this embodiment), impurity regions 420 provided so as to sandwich the channel formation region 416, intermetallic compound regions 424 in contact with the impurity regions 420, a gate insulating layer 408 over the channel formation region 416, and a gate electrode 410 over the gate insulating layer 408. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode" in some cases. That is, in this specification, the term "source electrode" may include a source region.

In the substrate 485, the transistor 460 is separated from other semiconductor elements (not illustrated) by an element separation region 406. The element separation region 406 can be formed by a local oxidation of silicon (LOCOS) method, a shallow trench isolation (STI) method, or the like. An insulating layer 428 and an insulating layer 430 are provided so as to cover the transistor 460. Note that in the transistor 460, sidewall insulating layers may be formed on side surfaces of the gate electrode 410, and a region whose impurity concentration is different from that of the impurity region 420 may be provided in the impurity regions 420.

The transistor 460 formed using a single crystal semiconductor can operate at high speed. Thus, when the transistor is used as a reading transistor, data can be read at a high speed. In this embodiment, before the transistor 462 and the capacitor 464 are formed, the insulating layer 428 and the insulating layer 430 are subjected to CMP treatment to be flat. At this time, the top surface of the gate electrode 410 is exposed.

For the insulating layer 428 and the insulating layer 430, as a typical example, an inorganic insulating material such as silicon oxide, silicon oxynitride, aluminum oxide, aluminum oxynitride, silicon nitride, aluminum nitride, silicon nitride oxide, or aluminum nitride oxide can be used. The insulating layer 428 and the insulating layer 430 can be formed by a plasma CVD method, a sputtering method, or the like.

Alternatively, an organic material such as a polyimide resin, an acrylic resin, or a benzocyclobutene resin can be used. Other than such organic materials, it is also possible to use a low-dielectric constant material (low-k material) or the like. In the case of using an organic material, the insulating layer 428 and the insulating layer 430 may be formed by a wet method such as a spin coating method or a printing method.

In this embodiment, silicon nitride is used for the insulating layer 428, and silicon oxide is used for the insulating layer 430.

Planarization treatment is preferably performed at least on a surface of the insulating layer 430 which is to be the formation region of an oxide semiconductor layer 444. In this embodiment, the oxide semiconductor layer 444 is formed over the insulating layer 430 which is sufficiently planarized by polishing treatment such as CMP treatment (the average surface roughness of the surface of the insulating layer 430 is preferably less than or equal to 0.15 nm).

The transistor 462 illustrated in FIG. 12A includes an oxide semiconductor for the semiconductor layer where a channel is formed. Thus, the off-state current of the transistor 462 is extremely small, and data can be held for a long time owing to such a transistor. In other words, refresh operation becomes unnecessary or the frequency of the refresh operation in a semiconductor memory device can be extremely lowered, which leads to a sufficient reduction in power consumption.

The transistor 462 includes the oxide semiconductor layer 444; an electrode 442a and an electrode 442b serving as a source electrode layer and a drain electrode layer, respectively; a gate insulating layer 446; and a gate electrode 448. The electrode 442a is connected to the gate electrode 410 of the transistor 460.

An insulating layer 435 and an insulating layer 450 are provided over the transistor 462. The insulating layer 450 can be formed as a single layer or a stack of layers using any of the following materials: silicon oxide obtained by a plasma CVD method, a sputtering method, or the like; an oxide insulator such as aluminum oxide; a nitride insulator such as silicon nitride or aluminum nitride; an oxynitride insulator such as silicon oxynitride or aluminum oxynitride; a nitride oxide insulator such as silicon nitride oxide; and the like. In the case where the insulating layer 450 is formed as a stack of layers using any of the above materials, the stack of layers may be formed using the same material or may be formed using different materials. In this embodiment, an insulating layer in which a silicon nitride film is stacked over a silicon oxynitride film is used as the insulating layer 450.

The insulating layer 435 can be formed using a material and a method similar to those of the insulating layer 428, the insulating layer 430, or the insulating layer 450. In this embodiment, a silicon oxynitride film is formed as the insulating layer 435 and a surface of the insulating layer 435 is planarized by CMP treatment.

Further, over the insulating layer 435, an electrode 453 is provided in a region overlapping with the electrode 442a of the transistor 462. The electrode 442a, the gate insulating layer 446, the insulating layer 450, the insulating layer 435, and the electrode 453 form the capacitor 464. That is, the electrode 442a of the transistor 462 functions as one electrode of the capacitor 464, and the electrode 453 functions as the other electrode of the capacitor 464. Note that in the case where a capacitor is not needed, the capacitor 464 may be omitted. Alternatively, the capacitor 464 may be separately provided above the transistor 462.

In addition, an electrode 456, which is formed using the same conductive layer as the electrode 453, is provided over the insulating layer 435. The electrode 456 is connected to the electrode 442b through an opening formed in the insulating layer 435, the insulating layer 450, and the gate insulating layer 446. Further, an insulating layer 452 is provided over the electrode 453 and the electrode 456. Over the insulating layer 452, a wiring or an insulating layer may be further provided.

The electrode 442b and the electrode 456 may be directly connected to each other. Alternatively, an electrode may be provided between the electrode 442b and the electrode 456 through which the electrode 442b and the electrode 456 are connected to each other. Further alternatively, the electrode 442b and the electrode 456 may be connected to each other through a plurality of electrodes.

Next, an example of a circuit configuration corresponding to FIGS. 12A and 12B is illustrated in FIG. 12C.

In FIG. 12C, a first line (1st Line) is electrically connected to a source electrode of the transistor 460. A second line (2nd Line) is electrically connected to a drain electrode of the transistor 460. A third wiring (3rd Line) is electrically connected to one of the source electrode and the drain electrode of the transistor 462. A fourth wiring (4th Line) is electrically connected to the gate electrode of the transistor 462. The gate electrode of the transistor 460, the other of the source electrode and the drain electrode of the transistor 462, and one electrode of the capacitor 464 are electrically connected to a node ND. A fifth wiring (5th line) is electrically connected to the other electrode of the capacitor 464. Note that the node ND in this embodiment corresponds to the node M1 in the above embodiment.

In the semiconductor device illustrated in FIG. 12C, data (charge) can be written to, held in, and read from the node ND. Since the off-state current of the transistor 462 is extremely small, the charge in the node ND is held for a long time.

When a transistor having a channel formation region formed using an oxide semiconductor and having extremely small off-state current is applied to the semiconductor device in this embodiment, charge can be held in the node ND for an extremely long period. In other words, power consumption can be adequately reduced because refresh operation becomes unnecessary or the frequency of refresh operation can be extremely lowered. Moreover, charge can be held in the node ND for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating layer does not occur at all. In other words, the semiconductor device according to one embodiment of the present invention does not have a limit on the number of writing cycles which is a problem in a conventional non-volatile memory, and reliability thereof is drastically improved. Furthermore, data is written depending on the on state and the off state of the transistor, whereby high-speed operation can be easily achieved.

This embodiment can be implemented in appropriate combination with any of the structures described in the other embodiments.

This application is based on Japanese Patent Application serial No. 2012-151234 filed with Japan Patent Office on Jul. 5, 2012, the entire contents of which are hereby incorporated by reference.

What is claimed is:

1. An electric device comprising:
a power supply circuit including a first transistor, a second transistor, a voltage regulator circuit, a power receiving antenna, and a power switch control circuit; and
a power storage device,
wherein the power receiving antenna is electrically connected to the voltage regulator circuit,
wherein a gate of each of the first transistor and the second transistor is electrically connected to the power switch control circuit,
wherein one of source and drain of each of the first transistor and the second transistor is electrically connected to the voltage regulator circuit,
wherein the other of source and drain of each of the first transistor and the second transistor is electrically connected to the power storage device, and
wherein each of the first transistor and the second transistor contains a semiconductor.

2. The electric device according to claim 1, wherein the semiconductor is an oxide semiconductor.

3. The electric device according to claim 1, wherein the electric device is a self-propelled vacuum cleaner.

4. An electric device comprising:
a power supply circuit including a first transistor, a second transistor, a voltage regulator circuit, a power receiving antenna, and a power switch control circuit;
a communication circuit;
a voltage detection circuit; and
a power storage device,
wherein the power receiving antenna is electrically connected to the voltage regulator circuit,
wherein a gate of each of the first transistor and the second transistor is electrically connected to the power switch control circuit,
wherein one of source and drain of each of the first transistor and the second transistor is electrically connected to the voltage regulator circuit,
wherein the other of source and drain of each of the first transistor and the second transistor is electrically connected to the power storage device,
wherein the communication circuit, the voltage detection circuit and the power storage device are electrically connected to each other, and
wherein each of the first transistor and the second transistor contains a semiconductor.

5. The electric device according to claim 4, wherein the semiconductor is an oxide semiconductor.

6. The electric device according to claim 4, wherein the electric device is a self-propelled vacuum cleaner.

* * * * *